US012630656B2

(12) United States Patent
Iwata et al.

(10) Patent No.: US 12,630,656 B2
(45) Date of Patent: May 19, 2026

(54) INFRARED CUT-OFF FILTER, SOLID-STATE IMAGE SENSOR FILTER, SOLID-STATE IMAGE SENSOR, AND METHOD FOR PRODUCING SOLID-STATE IMAGE SENSOR FILTER

(71) Applicant: TOPPAN Inc., Tokyo (JP)

(72) Inventors: Reiko Iwata, Taito-ku (JP); Yuri Nagai, Taito-ku (JP); Hanae Tagami, Taito-ku (JP); Shigeki Furukawa, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 821 days.

(21) Appl. No.: 17/812,768

(22) Filed: Jul. 15, 2022

(65) Prior Publication Data

US 2022/0372181 A1 Nov. 24, 2022

Related U.S. Application Data

(63) Continuation of application No. PCT/JP2021/001375, filed on Jan. 15, 2021.

(30) Foreign Application Priority Data

Jan. 15, 2020 (JP) ................................ 2020-004115
Feb. 6, 2020 (JP) ................................ 2020-019156
Feb. 14, 2020 (JP) ................................ 2020-023724

(51) Int. Cl.
*C08F 20/18* (2006.01)
*C08F 220/18* (2006.01)
(Continued)

(52) U.S. Cl.
CPC ............ *C08F 20/18* (2013.01); *C08F 220/18* (2013.01); *C08F 220/1806* (2020.02);
(Continued)

(58) Field of Classification Search
CPC ..... C08K 5/3417; C08L 33/06; C08F 220/30; C08F 220/301; C08F 222/404;
(Continued)

(56) References Cited

U.S. PATENT DOCUMENTS

| | | | |
|---|---|---|---|
| 10,903,278 | B2 | 1/2021 | Kataoka et al. |
| 2018/0120485 | A1 | 5/2018 | Oota et al. |

(Continued)

FOREIGN PATENT DOCUMENTS

| | | | |
|---|---|---|---|
| CN | 107922745 | A | 4/2018 |
| EP | 4 033 277 | A1 | 7/2022 |

(Continued)

OTHER PUBLICATIONS

Extended European Search Report issued on Jun. 5, 2023 in the corresponding European Patent Application No. 21741440.8, 8 pages.

(Continued)

*Primary Examiner* — Eli D. Strah
(74) *Attorney, Agent, or Firm* — Oblon, McClelland, Maier & Neustadt, L.L.P.

(57) ABSTRACT

An infrared cut-off filter, including a cyanine dye and a copolymer. The cyanine dye includes tris(pentafluoroethyl) trifluorophosphate and a cation having a polymethine and a nitrogen-containing heterocycle at each end of the polymethine. The copolymer includes a first repeating unit from a first monomer and a second repeating unit from a second monomer different from the first monomer. The first monomer includes a phenolic hydroxyl group.

19 Claims, 1 Drawing Sheet

(51) Int. Cl.

| | |
|---|---|
| ***C08F 220/30*** | (2006.01) |
| ***C08F 220/32*** | (2006.01) |
| ***C08K 5/14*** | (2006.01) |
| ***C08K 5/17*** | (2006.01) |
| ***C08K 5/3417*** | (2006.01) |
| ***C08K 5/47*** | (2006.01) |
| ***C08K 5/50*** | (2006.01) |
| ***G02B 1/04*** | (2006.01) |
| ***G02B 5/20*** | (2006.01) |
| ***G02B 5/22*** | (2006.01) |
| ***H01L 27/146*** | (2006.01) |
| ***H10F 39/00*** | (2025.01) |
| ***H10F 39/12*** | (2025.01) |
| *C08K 5/00* | (2006.01) |
| *H10F 39/18* | (2025.01) |

(52) U.S. Cl.
CPC ...... *C08F 220/1811* (2020.02); *C08F 220/30* (2013.01); *C08F 220/301* (2020.02); *C08F 220/325* (2020.02); *C08K 5/14* (2013.01); *C08K 5/17* (2013.01); *C08K 5/3417* (2013.01); *C08K 5/47* (2013.01); *C08K 5/50* (2013.01); *G02B 1/04* (2013.01); *G02B 5/208* (2013.01); *G02B 5/22* (2013.01); *G02B 5/223* (2013.01); *H10F 39/024* (2025.01); *H10F 39/12* (2025.01); *H10F 39/805* (2025.01); *C08K 5/0041* (2013.01); *H10F 39/182* (2025.01); *H10F 39/8053* (2025.01)

(58) Field of Classification Search
CPC ................ C08F 220/325; C08F 212/24; C08F 220/1806; C08F 220/1811
See application file for complete search history.

(56) References Cited

U.S. PATENT DOCUMENTS

| | | | |
|---|---|---|---|
| 2019/0259815 | A1 | 8/2019 | Kataoka et al. |
| 2021/0143219 | A1 | 5/2021 | Kataoka et al. |

FOREIGN PATENT DOCUMENTS

| | | | | | |
|---|---|---|---|---|---|
| JP | 2003-060176 | A | | 2/2003 | |
| JP | 2007-219114 | A | | 8/2007 | |
| JP | 2008-009206 | A | | 1/2008 | |
| JP | 2013155353 | A | * | 8/2013 | |
| JP | 2013-249467 | A | | 12/2013 | |
| JP | 2016-188357 | A | | 11/2016 | |
| JP | 2016-204650 | A | | 12/2016 | |
| JP | 2017-218580 | A | | 12/2017 | |
| JP | 2018-060910 | A | | 4/2018 | |
| WO | WO 2016/186050 | A1 | | 11/2016 | |
| WO | WO-2017098996 | A1 | * | 6/2017 | ............... C08K 5/36 |
| WO | WO 2018/101219 | A1 | | 6/2018 | |

OTHER PUBLICATIONS

Combined Chinese Office Action and Search Report issued Jul. 19, 2023 in Chinese Application 202180008145.4, 16 pages.
International Search Report issued Mar. 30, 2021 in PCT/JP2021/001375, filed Jan. 15, 2021, 7 pages, (with English Translation).

* cited by examiner

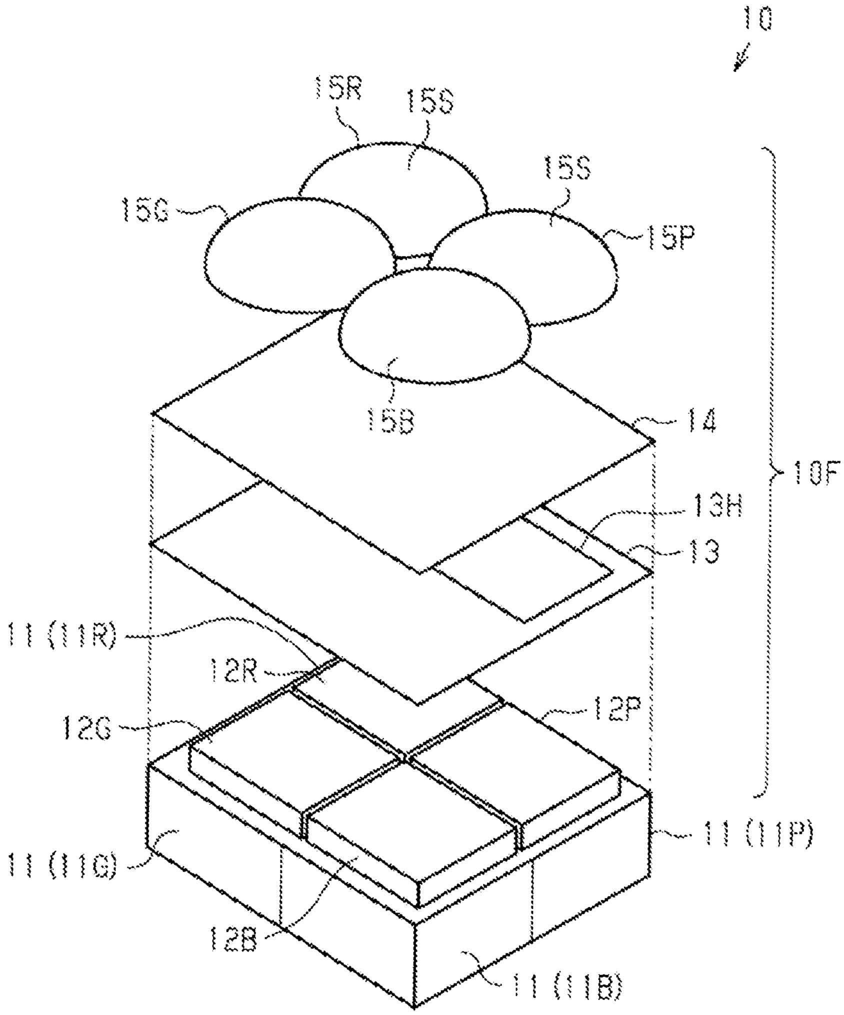
10
15R
15S
15S
15G
15P
15B
14
13H
13
10F
11 (11R)
12R
12P
12G
11 (11P)
11 (11G)
12B
11 (11B)

INFRARED CUT-OFF FILTER, SOLID-STATE IMAGE SENSOR FILTER, SOLID-STATE IMAGE SENSOR, AND METHOD FOR PRODUCING SOLID-STATE IMAGE SENSOR FILTER

CROSS-REFERENCE TO RELATED APPLICATIONS

The present application is a continuation of International Application No. PCT/JP2021/001375, filed Jan. 15, 2021, which is based upon and claims the benefits of priority to Japanese Application No. JP2020-004115, filed Jan. 15, 2020, Japanese Application No. JP2020-023724, filed Feb. 14, 2020, and Japanese Application No. JP2020-019156, filed Feb. 6, 2020. The entire contents of all of the above applications are incorporated herein by reference.

BACKGROUND OF THE INVENTION

Field of the Invention

The present invention relates to an infrared cut-off filter, a solid-state image sensor filter, a solid-state image sensor, and a method for producing the solid-state image sensor filter.

Discussion of the Background

Solid-state image sensors such as CMOS image sensors and CCD image sensors include photoelectric conversion elements that convert the intensity of light into an electrical signal. An example of the solid-state image sensor is capable of detecting light corresponding to each of a plurality of colors. A first example of the solid-state image sensor includes color filters for respective colors and color photoelectric conversion elements for the respective colors, and detects respective light colors using the photoelectric conversion elements for respective colors (for example, see PTL 1). A second example of the solid-state image sensor includes an organic photoelectric conversion element and an inorganic photoelectric conversion element, and detects respective light colors using the respective photoelectric conversion elements without using a color filter (for example, see PTL 2).

The solid-state image sensor includes an infrared cut-off filter on the photoelectric conversion element. The infrared-absorbing dye included in the infrared cut-off filter absorbs infrared light, to cut off infrared light which may otherwise be detected by the respective photoelectric conversion elements, to prevent it from reaching the photoelectric conversion elements. Accordingly, detection accuracy of visible light in the respective photoelectric conversion elements can be improved. The infrared cut-off filter may contain, for example, a cyanine dye which is an infrared absorbing dye (for example, see PTL 3).

PTL 1: JP 2003-060176 A
PTL 2: JP 2018-060910 A
PTL 3: JP 2007-219114 A

SUMMARY OF THE INVENTION

According to an aspect of the present invention, an infrared cut-off filter includes a film including a cyanine dye and a copolymer. The cyanine dye includes tris(pentafluoroethyl) trifluorophosphate and a cation having a polymethine and a nitrogen-containing heterocycle at each end of the polymethine. The copolymer includes a first repeating unit from a first monomer and a second repeating unit from a second monomer different from the first monomer, and the first monomer includes a phenolic hydroxyl group.

According to another aspect of the present invention, a method for producing a solid-state image sensor filter includes forming an infrared cut-off filter from a cyanine dye and a copolymer, and patterning the infrared cut-off filter by dry etching. The cyanine dye includes tris(pentafluoroethyl) trifluorophosphate and a cation having a polymethine and a nitrogen-containing heterocycle at each end of the polymethine, the copolymer includes a first repeating unit from a first monomer and a second repeating unit from a second monomer different from the first monomer, and the first monomer includes a phenolic hydroxyl group.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGURE is an exploded perspective view of a structure of a solid-state image sensor according to a first embodiment.

DESCRIPTION OF THE EMBODIMENTS

The embodiments will now be described with reference to the accompanying drawings, wherein like reference numerals designate corresponding or identical elements throughout the various drawings.

First Embodiment

With reference to FIGURE, a first embodiment of an infrared cut-off filter, a solid-state image sensor filter, a solid-state image sensor, and a method for producing a solid-state image sensor will be described. In the following description, a solid-state image sensor, an infrared cut-off filter, a method for producing a solid-state image sensor filter, preparation examples and test examples will be described in this order. In the present embodiment, infrared light is light having a wavelength in the range of 0.7 μm (700 nm) or more and 1 mm or less, and near-infrared light is light specifically having a wavelength in the range of 700 nm or more and 1100 nm or less, of infrared light. In the present embodiment, visible light is light having a wavelength in the range of 400 nm or more and less than 700 nm.

<Solid-State Image Sensor>

With reference to FIGURE, a solid-state image sensor will be described. FIGURE is a schematic configuration diagram in which layers in part of a solid-state image sensor are separately illustrated.

As shown in FIGURE, a solid-state image sensor 10 includes a solid-state image sensor filter 10F and a plurality of photoelectric conversion elements 11.

The plurality of photoelectric conversion elements 11 include a red photoelectric conversion element 11R, a green photoelectric conversion element 11G, a blue photoelectric conversion element 11B and an infrared photoelectric conversion element 11P. The photoelectric conversion elements 11R, 11G and 11B for respective colors measure the intensity of visible light at specific wavelengths corresponding to the photoelectric conversion elements 11R, 11G and 11B, respectively. Each infrared photoelectric conversion element 11P measures the intensity of infrared light.

The solid-state image sensor 10 includes a plurality of red photoelectric conversion elements 11R, a plurality of green photoelectric conversion elements 11G, a plurality of blue photoelectric conversion elements 11B, and a plurality of infrared photoelectric conversion elements 11P. It should be noted that FIGURE illustrates a repeating unit of the photoelectric conversion element 11 in the solid-state image sensor 10 for convenience of illustration.

The solid-state image sensor filter 10F includes a plurality of visible light filters, an infrared pass filter 12P, an infrared cut-off filter 13, a barrier layer 14, a plurality of visible light microlenses and an infrared microlens 15P.

The visible light color filters include a red filter 12R, a green filter 12G and a blue filter 12B. The red filter 12R is disposed on a light-incident side of the red photoelectric conversion element 11R. The green filter 12G is disposed on a light-incident side of the green photoelectric conversion element 11G. The blue filter 12B is disposed on a light-incident side of the blue photoelectric conversion element 11B.

The infrared pass filter 12P is disposed on a light-incident side of the infrared photoelectric conversion element 11P. The infrared pass filter 12P cuts off the visible light which may otherwise be detected by the infrared photoelectric conversion element 11P to prevent it from reaching the infrared photoelectric conversion element 11P. That is, the infrared pass filter 12P suppresses transmission of visible light to the infrared photoelectric conversion element 11P. This improves detection accuracy of infrared light by the infrared photoelectric conversion element 11P. The infrared light that may be detected by the infrared photoelectric conversion element 11P may be, for example, near-infrared light.

The infrared cut-off filter 13 is disposed on a light-incident side of the respective color filters 12R, 12G, and 12B. The infrared cut-off filter 13 has a through-hole 13H. The infrared pass filter 12P is located in a region defined by the through-hole 13H when viewed in a direction perpendicular to a plane in which the infrared cut-off filter 13 extends. On the other hand, the infrared cut-off filter 13 is located on the red filter 12R, the green filter 12G and the blue filter 12B when viewed in a direction perpendicular to a plane in which the infrared cut-off filter 13 extends.

The infrared cut-off filter 13 includes a cyanine dye, which is an infrared absorbing dye. The cyanine dye has an infrared absorbance peak at wavelengths of near-infrared light. Therefore, the infrared cut-off filter 13 can reliably absorb near-infrared light passing through the infrared cut-off filter 13. Accordingly, the infrared cut-off filter 13 sufficiently cuts off near-infrared light that may otherwise be detected by the respective color photoelectric conversion elements 11. That is, the infrared cut-off filter 13 suppresses transmission of infrared light to the respective color photoelectric conversion elements 11. The infrared cut-off filter 13 can have a thickness of, for example, 300 nm or more and 3 μm or less.

The barrier layer 14 prevents an oxidation source of the infrared cut-off filter 13 from passing therethrough toward the infrared cut-off filter 13. The oxidation source may be oxygen, water, or the like. The barrier layer 14 preferably has an oxygen transmission rate of, for example, 5.0 $cc/m^2$/day/atm or less. That is, the oxygen transmission rate is preferably 5.0 $cm^3/m^2$/day/atm. The oxygen transmission rate is a value in accordance with Appendix A of JIS K 7126-2:2006, at 23° C. and RH 50%. Due to the oxygen transmission rate being set to 5.0 $cc/m^2$/day/atm or less, the barrier layer 14 prevents an oxidation source from reaching the infrared cut-off filter 13 so that the infrared cut-off filter 13 is not likely to be oxidized by the oxidation source. Accordingly, the light resistance of the infrared cut-off filter 13 can be enhanced.

The material forming the barrier layer 14 is an inorganic compound. The material forming the barrier layer 14 is preferably a silicon compound. The material forming the barrier layer 14 may be, for example, at least one selected from the group consisting of silicon nitride, silicon oxide and silicon oxynitride.

The microlenses include the red microlens 15R, the green microlens 15G, the blue microlens 15B and the infrared microlens 15P. The red microlens 15R is disposed on a light-incident side of the red filter 12R. The green microlens 15G is disposed on a light-incident side of the green filter 12G. The blue microlens 15B is disposed on a light-incident side of the blue filter 12B. The infrared microlens 15P is disposed on a light-incident side of the infrared pass filter 12P.

The microlenses 15R, 15G, 15B and 15P each have a light-incident surface 15S which is an outer surface. In order to collect light incident on the light-incident surface 15S toward the respective photoelectric conversion elements 11R, 11G, 11B and 11P, the respective microlenses 15R, 15G, 15B and 15P have a refractive index different from that of the outside air, that is, the atmosphere around the microlenses 15R, 15G, 15B and 15P. The respective microlenses 15R, 15G, 15B and 15P contain a transparent resin.

<Infrared Cut-Off Filter>

The infrared cut-off filter 13 will be described in more detail below.

The infrared cut-off filter 13 contains a cyanine dye and a copolymer. The infrared cut-off filter 13 may contain a radical polymerization initiator. The radical polymerization initiator is used in production of a copolymer for forming the infrared cut-off filter 13. The cyanine dye contains a cation and an anion. The cation has a polymethine and two heterocycles containing nitrogen. The two heterocycles are located one at each end of the polymethine. The anion is tris(pentafluoroethyl) trifluorophosphate (FAP) anion.

The cyanine dye may also have a structure represented by formula (3) below.

Chem. 1

Formula (3)

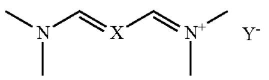

In the above formula (3), X is one methine or a polymethine. A hydrogen atom bonded to a carbon atom contained in the methine may also be substituted by a halogen atom or an organic group. The polymethine may also have a cyclic structure containing carbons that constitutes the polymethine. The cyclic structure can contain three consecutive carbons in a plurality of carbons that constitute the polymethine. When the polymethine has a cyclic structure, the polymethine may have 5 or more carbon atoms. Each nitrogen atom is contained in a 5-membered or 6-membered heterocycle. The heterocycles may be fused. In formula (3), Y is an anion.

Further, the cyanine dye may have a structure represented by formula (4) below.

Chem. 2

Formula (4)

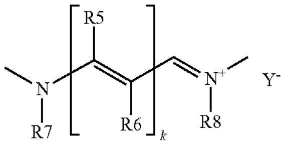

In the above formula (4), k is 1 or higher integer. k represents the number of repeating units contained in the polymethine chain. R5 and R6 are hydrogen atoms or organic groups. R7 and R8 are hydrogen atoms or organic groups. R7 and R8 are preferably linear alkyl groups having 1 or more carbon atoms or branched alkyl groups. Each nitrogen atom is contained in a 5-membered or 6-membered heterocycle. The heterocycles may be fused. In formula (4), Y is an anion.

Furthermore, when the polymethine has a cyclic structure in formula (3), the cyclic structure may include, for example, at least one unsaturated bond such as an ethylenic double bond such that the unsaturated bond has electron resonance as part of the polymethine chain. Examples of such cyclic structure include cyclopentene rings, cyclopentadiene rings, cyclohexene rings, cyclohexadiene rings, cycloheptene rings, cyclooctene rings, cyclooctadiene rings and benzene rings. These cyclic structures may include substituents.

Furthermore, in formula (4), a compound where k is 1 is cyanine, a compound where k is 2 is carbocyanine, and a compound where k is 3 is dicarbocyanine. In formula (4), a compound where k is 4 is tricarbocyanine.

Examples of the organic group of R5 and R6 may include an alkyl group, an aryl group, an aralkyl group, and an alkenyl group. The alkyl group may be, for example, a methyl group, an ethyl group, a propyl group, an isopropyl group, an n-butyl group, a sec-butyl group, an isobutyl group, a tert-butyl group, an isopentyl group, a neopentyl group, a hexyl group, a cyclohexyl group, an octyl group, a nonyl group, a decyl group, or the like. The aryl group may be, for example, a phenyl group, a tolyl group, a xylyl group, a naphthyl group, or the like. The aralkyl group may be, for example, a benzyl group, a phenylethyl group, a phenylpropyl group, or the like. The alkenyl group may be, for example, a vinyl group, an allyl group, a propenyl group, an isopropenyl group, a butenyl group, a hexenyl group, a cyclohexenyl group, an octenyl group, or the like.

Further, at least part of the hydrogen atoms contained in each organic group may be substituted by a halogen atom or a cyano group. The halogen atom may be fluorine, bromine, chlorine, or the like. The substituted organic group may be, for example, a chloromethyl group, a chloropropyl group, a bromoethyl group, a trifluoropropyl group, a cyanoethyl group, or the like.

R7 or R8 may be, for example, an ethyl group, a propyl group, an isopropyl group, an n-butyl group, a sec-butyl group, an isobutyl group, a tert-butyl group, an isopentyl group, a neopentyl group, a hexyl group, a cyclohexyl group, an octyl group, a nonyl group, a decyl group, or the like.

A heterocycle containing a nitrogen atom may be, for example, pyrrole, imidazole, thiazole, pyridine, or the like.

A cation contained in the cyanine dye may have a structure represented by, for example, formula (5) or formula (6) below.

Chem. 3

Formula (5)

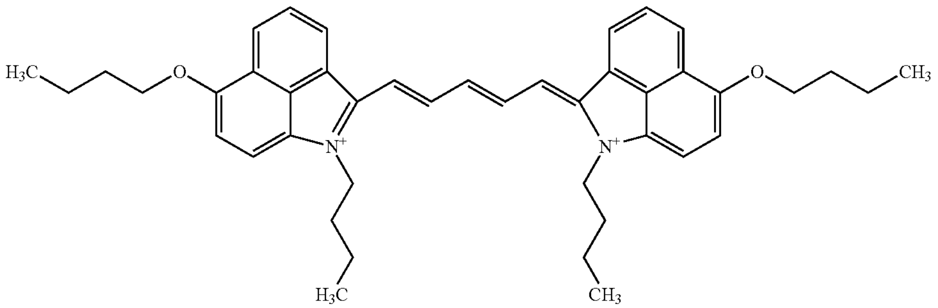

Chem. 4

Formula (6)

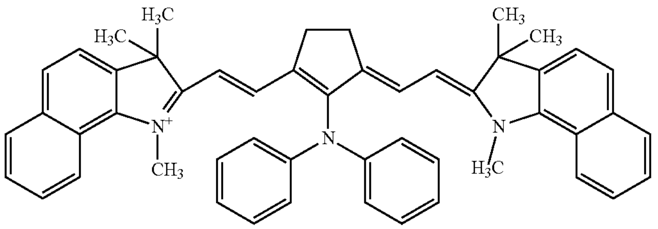

Further, a cation contained in the cyanine dye may have a structure represented by, for example, formula (7) to formula (46) below. That is, each nitrogen atom contained in the cyanine dye may be contained in the cyclic structures shown below.

Chem. 5
Formula (7)
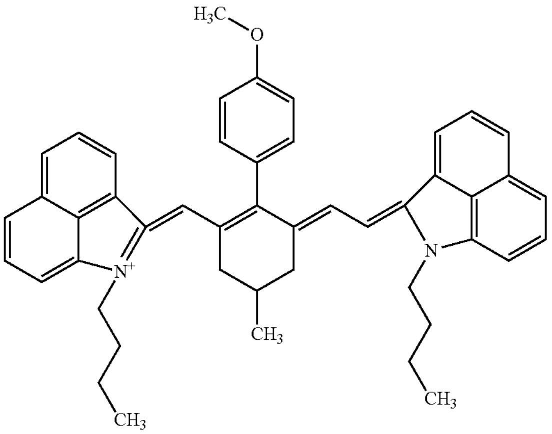
Chem. 6
Formula (8)
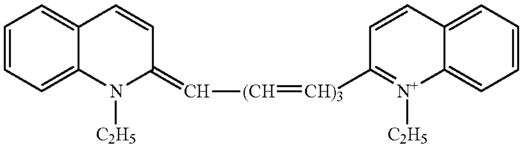
Chem. 7
Formula (9)
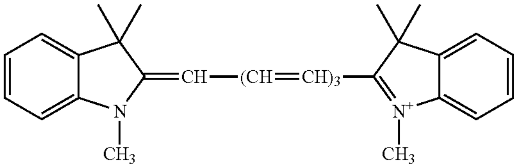
Chem. 8
Formula (10)
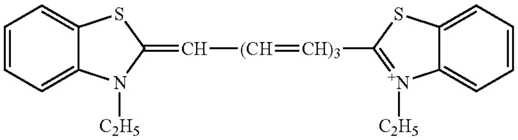
Chem. 9
Formula (11)
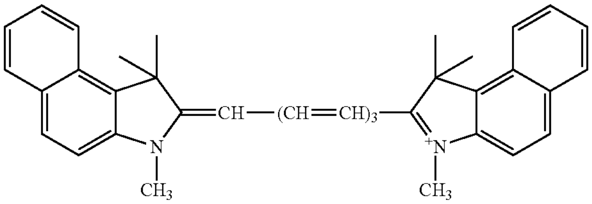
Chem. 10
Formula (12)
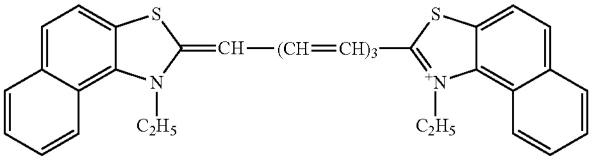

-continued
Chem. 11
Formula (13)
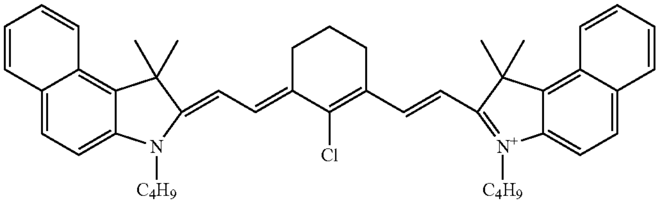
Chem. 12
Formula (14)
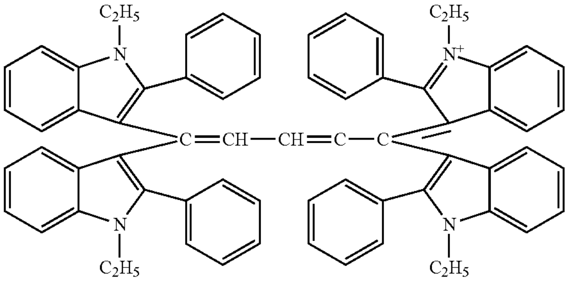
Chem. 13
Formula (15)
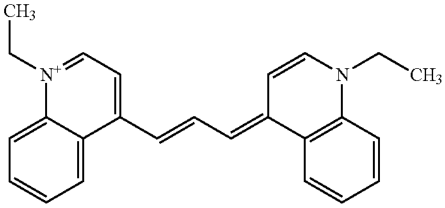
Chem. 14
Formula (16)
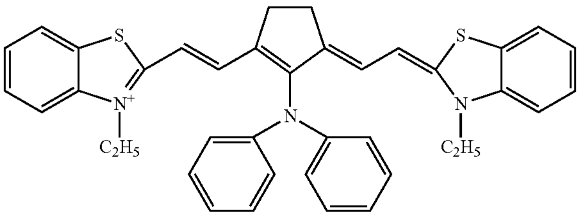
Chem. 15
Formula (17)
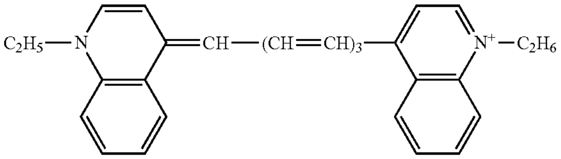
Chem. 16
Formula (18)
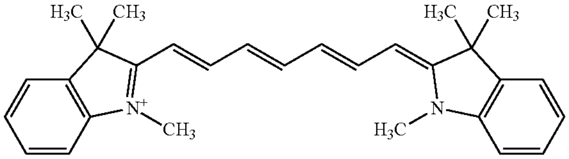

-continued
Chem. 17
Formula (19)
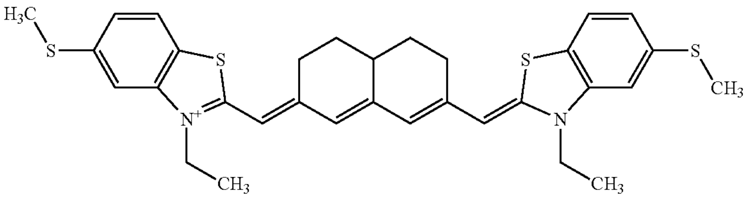
Chem. 18
Formula (20)
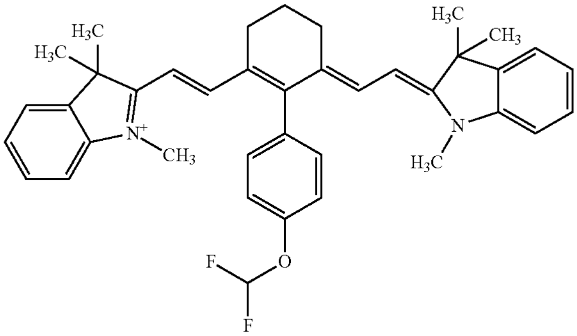
Chem. 19
Formula (21)
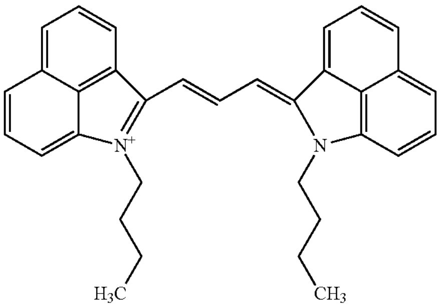
Chem. 20
Formula (22)
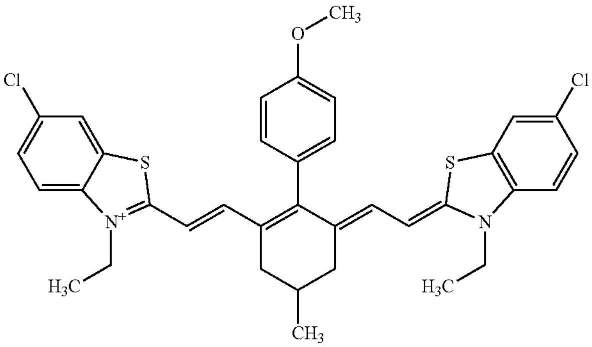

-continued
Chem. 21
Formula (23)
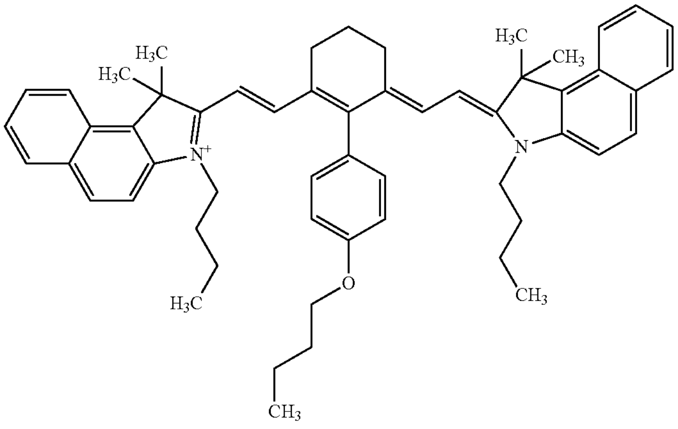
Chem. 22
Formula (24)
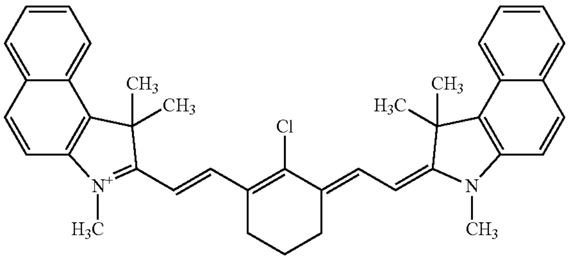
Chem. 23
Formula (25)
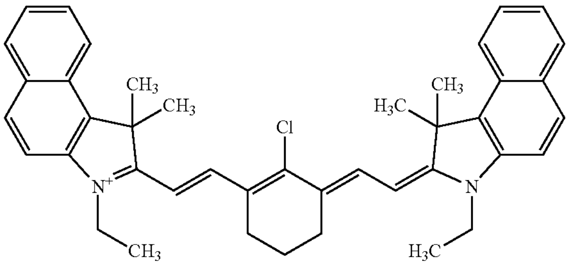
Chem. 24
Formula (26)
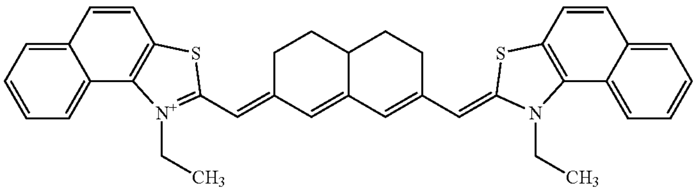

-continued
Chem. 25
Formula (27)
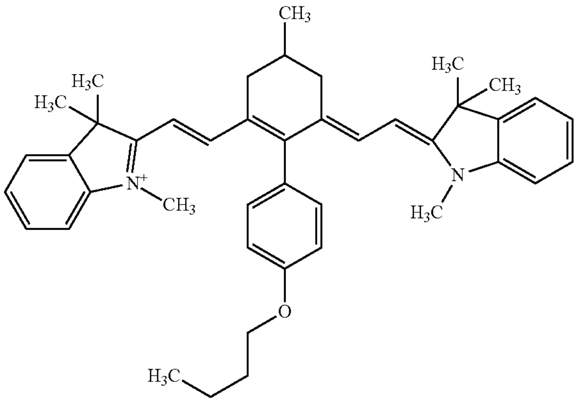
Chem. 26
Formula (28)
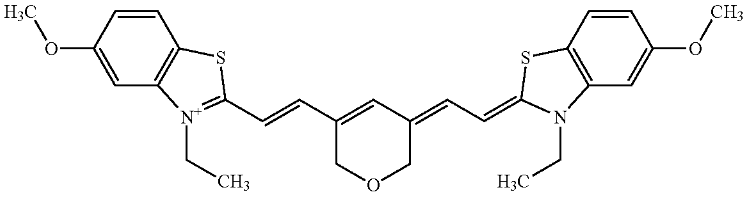
Chem. 27
Formula (29)
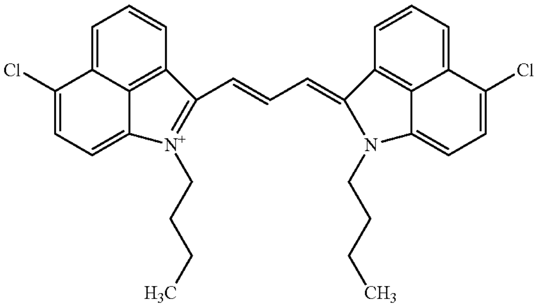
Chem. 28
Formula (30)
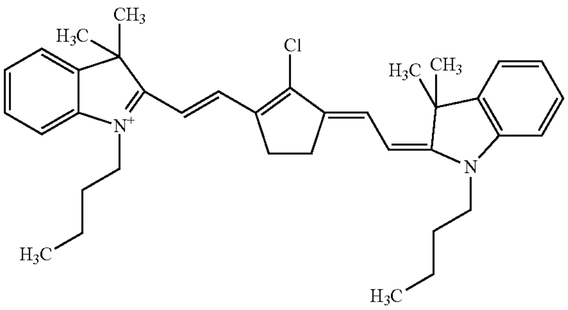

-continued
Chem. 29
Formula (31)
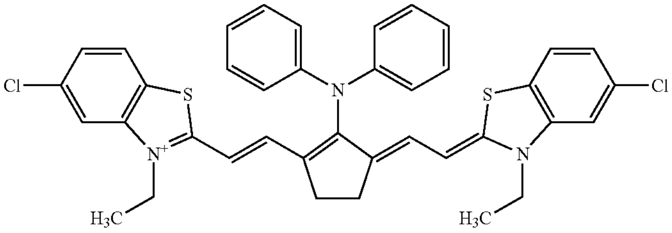
Chem. 30
Formula (32)
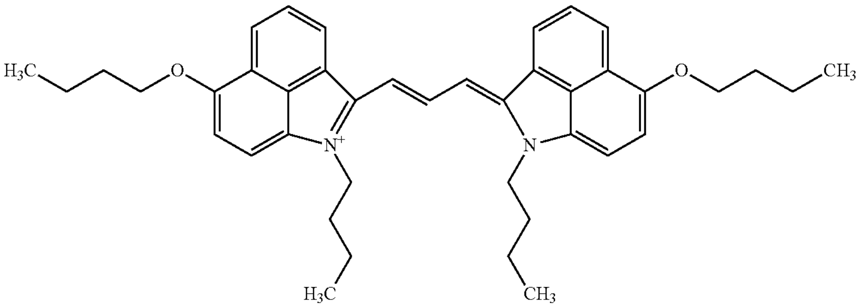
Chem. 31
Formula (33)
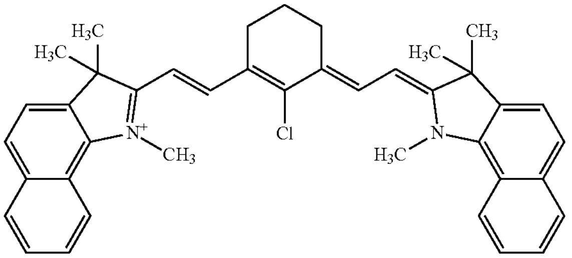
Chem. 32
Formula (34)
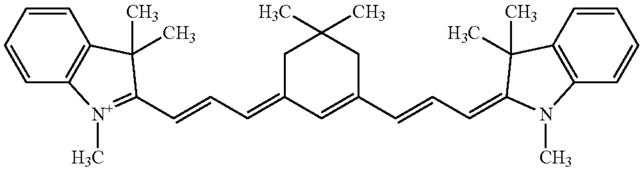
Chem. 33
Formula (35)
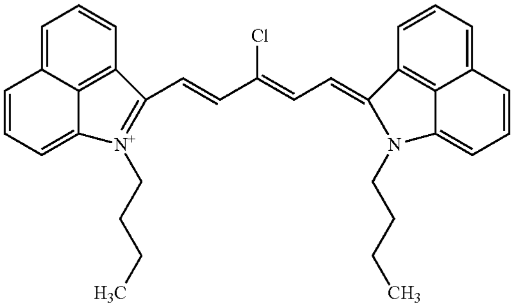

-continued
Chem. 34
Formula (36)
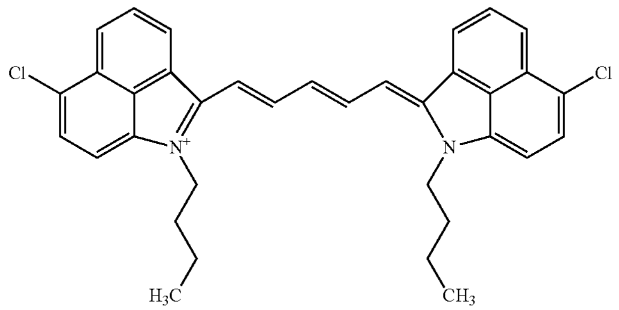
Chem. 35
Formula (37)
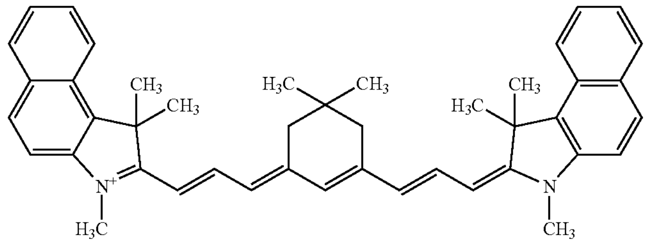
Chem. 36
Formula (38)
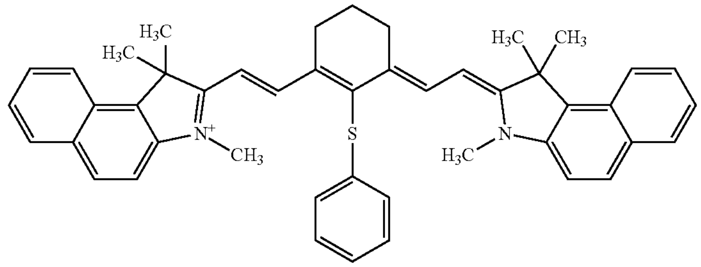
Chem. 37
Formula (39)
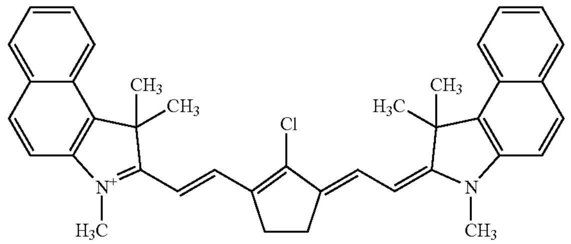
Chem. 38
Formula (40)
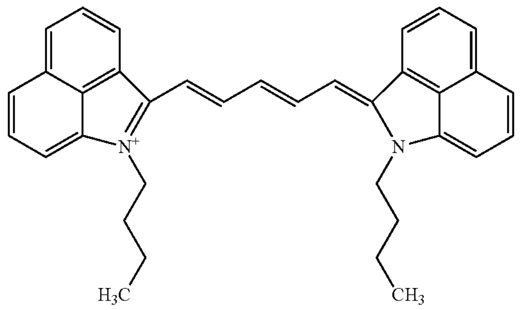

-continued
Chem. 39
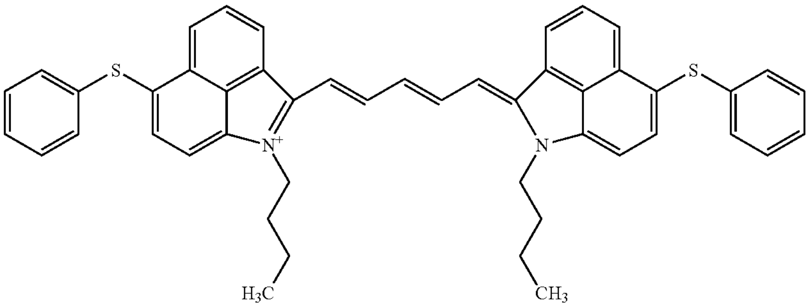
Formula (41)
Chem. 40
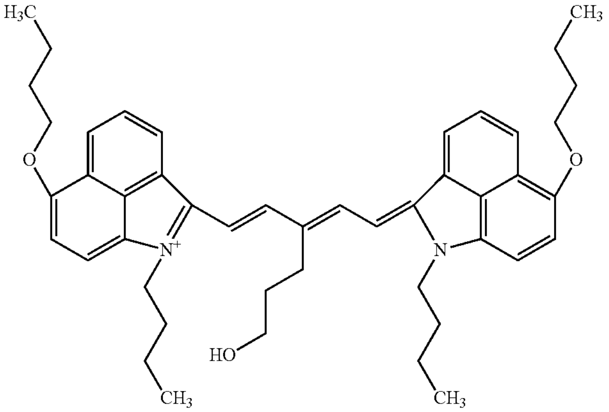
Formula (42)
Chem. 41
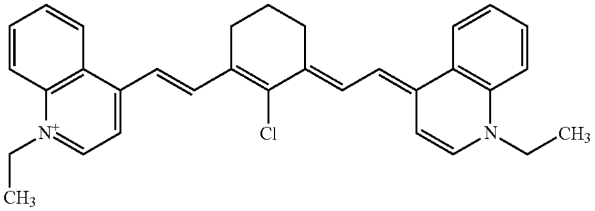
Formula (43)
Chem. 42
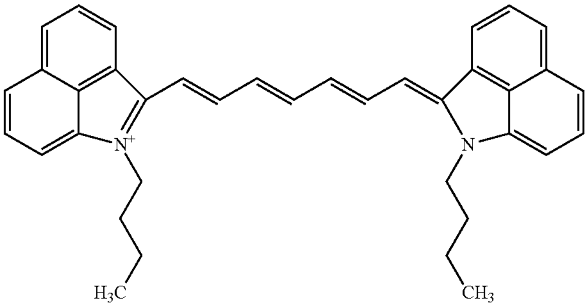
Formula (44)

-continued

Chem. 43

Formula (45)

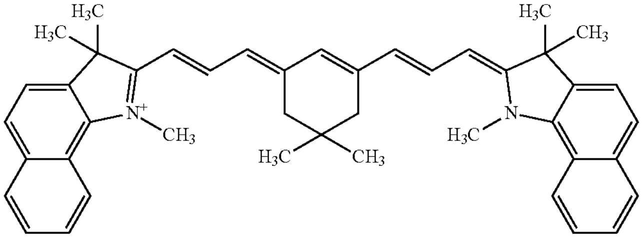

Chem. 44

Formula (46)

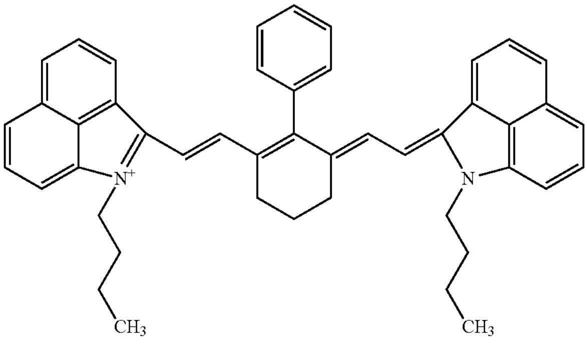

The cyanine dye has an infrared absorbance peak at a wavelength of 700 nm or more and 1100 nm or less. Therefore, the infrared cut-off filter 13 can reliably absorb near-infrared light passing through the infrared cut-off filter 13. Accordingly, the infrared cut-off filter 13 sufficiently cuts off near-infrared light that may otherwise be detected by the respective color photoelectric conversion elements 11.

Further, when infrared light passes through the infrared cut-off filter 13 having a cyanine dye, a transmittance T at a wavelength λ is represented by a ratio (TL/IL) of an intensity of transmitted light (TL) to an intensity of incident light (IL). The transmittance T is the intensity of transmitted light when the intensity of incident light to the infrared cut-off filter 13 is 1, and a value obtained by multiplying the transmittance T by 100 is the transmittance percent % T.

An absorbance Aλ at the wavelength λ is calculated by mathematical formula (1) below:

$$A\lambda = -\log_{10}(\%\ T/100)$$ Mathematical formula (1)

The tris(pentafluoroethyl) trifluorophosphate anion ($[(C_2F_5)_3PF_3]^-$) has a structure represented by formula (47) below.

Chem. 45

Formula (47)

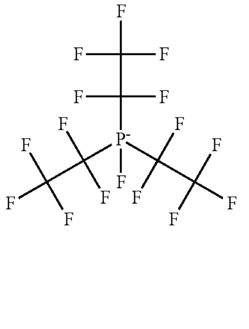

In production of the solid-state image sensor 10, the infrared cut-off filter 13 is heated to approximately 200° C. When heated to approximately 200° C., the above-mentioned cyanine dye changes its structure, which may reduce infrared light absorbance of the cyanine dye.

In this regard, since the FAP has a molecular weight and molecular structure capable of being located near a polymethine chain of the cyanine dye, the polymethine chain of the cyanine dye is prevented from being broken when the cyanine dye is heated. Therefore, a decrease in infrared absorbance of the cyanine dye due to the cyanine dye being heated is prevented, and thus a decrease in infrared absorbance of the infrared cut-off filter 13 is prevented.

As described above, the infrared cut-off filter 13 contains a copolymer. The copolymer may contain a repeating unit derived from a monomer containing acrylic acid or methacrylic acid. The monomer containing acrylic acid is an acrylate, and the monomer containing methacrylic acid is a methacrylate.

The copolymer contains a first repeating unit and a second repeating unit. The first repeating unit is derived from a monomer having a phenolic hydroxyl group. The second repeating unit is preferably derived from an acrylic monomer having an aromatic ring represented by formula (1) below or an acrylic monomer having an alicyclic structure represented by formula (2) below.

Chem. 46

Formula (1)

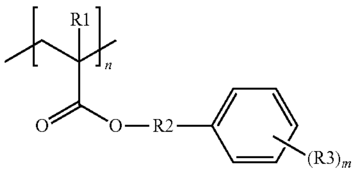

-continued

Chem. 47

Formula (2)

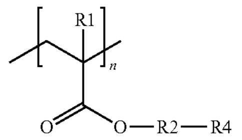

In formulae (1) and (2), R1 is a hydrogen atom or a methyl group, and R2 is a single bond, a linear alkylene group having 1 or more carbon atoms, or a branched alkylene group having 3 or more carbon atoms. R3 is a hydrogen atom or a predetermined substituent. In formula (1), m is any integer from 1 to 5 when R3 is a substituent. In formula (2), R4 is an alicyclic structure having 3 or more carbon atoms.

Examples of the monomer having a phenolic hydroxyl group include 4-hydroxyphenyl (meth)acrylate, 4-hydroxyphenyl (meth)acrylamide, 3-(tert-butyl)-4-hydroxyphenyl (meth)acrylate, 4-(tert-butyl)-2-hydroxyphenyl (meth)acrylate, 4-hydroxyphenyl maleimide, 3-hydroxyphenyl maleimide, p-hydroxystyrene, and α-methyl-p-hydroxystyrene. A polymer produced by using the monomer having a phenolic hydroxyl group contains a phenolic hydroxyl group in the side chain.

Examples of the acrylic monomer having an aromatic ring include benzyl (meth)acrylate, phenyl (meth)acrylate, phenoxyethyl (meth)acrylate, phenoxypolyethylene glycol (meth)acrylate, nonylphenoxy polyethylene glycol (meth) acrylate, phenoxypolypropylene glycol (meth)acrylate, 2-(meth)acryloyloxyethyl-2-hydroxypropyl phthalate, 2-hydroxy-3-phenoxypropyl (meth)acrylate, 2-(meth)acryloyl oxyethyl hydrogen phthalate, 2-(meth)acryloyl oxypropyl hydrogen phthalate, ethoxylated ortho-phenyl phenol (meth) acrylate, o-phenyl phenoxyethyl (meth)acrylate, 3-phenoxy benzyl (meth)acrylate, 4-hydroxyphenyl (meth)acrylate, 2-naphthol (meth)acrylate, 4-biphenyl (meth)acrylate, 9-anthrylmethyl (meth)acrylate, 2-[3-(2H-benzotriazole-2-yl)-4-hydroxyphenyl]ethyl (meth)acrylate, phenol ethylene oxide (EO) modified acrylate, nonylphenol EO modified acrylate, 2-(meth)acryloyloxyethyl phthalate, and 2-(meth)acryloyloxyethyl hexahydrophthalate.

The second repeating unit is more preferably a unit structure derived from any one selected from the group consisting of phenyl methacrylate and 4-biphenyl methacrylate among the above-mentioned acrylic monomer having aromatic ring.

Examples of the acrylic monomer having an alicyclic structure include cyclopentyl (meth)acrylate, cyclohexyl (meth)acrylate, 4-t-cyclohexyl (meth)acrylate, isobornyl (meth)acrylate, dicyclopentanyl (meth)acrylate, dicyclopentenyl (meth)acrylate, adamantyl (meth)acrylate, norbornyl (meth)acrylate, tricyclodecanyl (meth)acrylate, dicyclopentadienyl (meth)acrylate, and tetracyclododecyl (meth)acrylate.

The second repeating unit is more preferably a unit structure derived from any one selected from the group consisting of dicyclopentanyl methacrylate and cyclohexyl methacrylate among the above-mentioned acrylic monomer having an alicyclic structure.

A polymer solution used for forming the infrared cut-off filter 13 may contain a radical polymerization initiator used for polymerization of the monomer. The radical polymerization initiator contained in the infrared cut-off filter 13 may be activated to generate radicals when the infrared cut-off filter 13 is heated. These radicals are captured by the copolymer containing the first repeating unit. Therefore, even when the infrared cut-off filter 13 contains a radical polymerization initiator, the copolymer containing the first repeating unit and the second repeating unit can prevent the cyanine dye from being decomposed or denatured by radicals. Thus, the infrared cut-off filter 13 can be prevented from being deteriorated by heating.

When the copolymer is composed of only the first repeating unit and the second repeating unit and the second repeating unit is derived from a monomer having a phenolic hydroxyl group, the copolymer preferably contains 5 wt. % or more and 30 wt. % or less of the first repeating unit and 70 wt. % or more of the second repeating unit. In this case, the total amount of the copolymer is 100 wt. %. A coating film used in production of the infrared cut-off filter contains a cyanine dye and a copolymer. Due to the first repeating unit and the second repeating unit being contained at the ratio described above, it is possible to prevent the transmittance of the infrared cut-off filter from increasing at the time of production of the infrared cut-off filter, and prevent the infrared cut-off filter from being deteriorated by heating.

The copolymer may contain a repeating unit derived from an acrylic monomer having a cyclic ether. Examples of the monomer containing a cyclic ether group include glycidyl (meth)acrylate, 2-methylglycidyl (meth)acrylate, 2-ethylglycidyl (meth)acrylate, 2-oxiranylethyl (meth)acrylate, 2-glycidyloxyethyl (meth)acrylate, 3-glycidyloxypropyl (meth)acrylate, glycidyloxyphenyl (meth)acrylate, oxetanyl (meth)acrylate, 3-methyl-3-oxetanyl (meth)acrylate, 3-ethyl-3-oxetanyl (meth)acrylate, (3-methyl-3-oxetanyl) methyl (meth)acrylate, (3-ethyl-3-oxetanyl) methyl (meth) acrylate, 2-(3-methyl-3-oxetanyl) ethyl (meth)acrylate, 2-(3-ethyl-3-oxetanyl) ethyl (meth)acrylate, 2-[(3-methyl-3-oxetanyl) methyloxy]ethyl (meth)acrylate, 2-[(3-ethyl-3-oxetanyl) methyloxy] ethyl (meth)acrylate, 3-[(3-methyl-3-oxetanyl) methyloxy] propyl (meth)acrylate, 3-[(3-ethyl-3-oxetanyl) methyloxy] propyl (meth)acrylate, and tetrahydrofurfuryl (meth)acrylate.

The copolymer may further contain a third repeating unit derived from glycidyl methacrylate. When the copolymer contains the third repeating unit, the copolymer preferably contains 70 wt. % or more of the second repeating unit and 5 wt. % or more and 20 wt. % or less of the third repeating unit, and a ratio of a weight of the first repeating unit to a weight of the third repeating unit is preferably 0.5 or more. In this case, the total amount of the copolymer is 100 wt. %. Accordingly, when the infrared cut-off filter 13 is produced using a copolymer having the third repeating unit, the infrared cut-off filter 13 has enhanced heat resistance.

The copolymer may be composed of only the first repeating unit, the second repeating unit and the third repeating unit, or may contain a repeating unit derived from a monomer other than the above-mentioned monomers.

Examples of the monomer other than the above-mentioned monomers include a styrene monomer, (meth)acrylic monomer, vinyl ester monomer, vinyl ether monomer, halogen-containing vinyl monomer, and diene monomer. The styrene monomer may be, for example, styrene, α-methyl styrene, p-methyl styrene, m-methyl styrene, p-methoxy styrene, p-hydroxy styrene, p-acetoxy styrene, vinyl toluene, ethyl styrene, phenyl styrene, benzyl styrene, or the like. The (meth)acrylic monomer may be, for example, methyl acrylate, ethyl acrylate, butyl acrylate, 2-ethylhexyl acrylate, methyl methacrylate, ethyl methacrylate, butyl methacrylate, 2-ethylhexyl methacrylate, or the like. The vinyl ester monomer may be, for example, vinyl acetate. The vinyl ether monomer may be, for example, vinyl methyl ether. The halogen-containing vinyl monomer may be, for example, vinyl chloride. The diene monomer may be, for example, butadiene, isobutylene, or the like.

Further, the copolymer may be polymerized with a monomer for adjusting the polarity of the copolymer. The monomer for adjusting the polarity adds an acid group or a hydroxyl group to the copolymer. Examples of such a monomer include acrylic acid, methacrylic acid, maleic anhydride, maleic acid half ester, 2-hydroxyethyl acrylate, and 4-hydroxyphenyl (meth)acrylate.

The copolymer may have any of structures of random copolymer, alternating copolymer, block copolymer, and graft copolymer. When the copolymer has a random copolymer structure, it is easy to prepare a coating liquid for forming the infrared cut-off filter by the production process and mixing with a cyanine dye. Therefore, a random copolymer is more preferred than other copolymers.

As the polymerization method for obtaining a copolymer, radical polymerization can be used. The radical polymerization is preferred since it is easily industrially produced. The radical polymerization may be solution polymerization, emulsion polymerization, bulk polymerization, suspension polymerization, or the like. Preferably, solution polymerization is used for the radical polymerization. Using the solution polymerization facilitates control of the molecular weight of the copolymer. Further, a solution containing the copolymer after the monomer polymerization in the state as it is can be used for producing a solid-state image sensor filter.

In the solution polymerization, the above monomers may be diluted with a polymerization solvent, and then a polymerization initiator may be added thereto to perform polymerization of monomers.

Examples of the polymerization solvent include an ester solvent, an alcohol ether solvent, a ketone solvent, an aromatic solvent, an amide solvent and an alcohol solvent. The ester solvent may be, for example, methyl acetate, ethyl acetate, n-butyl acetate, isobutyl acetate, t-butyl acetate, methyl lactate, ethyl lactate, or the like. The alcohol ether solvent may be, for example, ethylene glycol monomethyl ether, ethylene glycol monoethyl ether, propylene glycol monomethyl ether, propylene glycol monomethyl ether acetate, propylene glycol monoethyl ether, 3-methoxy-1-butanol, 3-methoxy-3-methyl-1-butanol, or the like. The ketone solvent may be, for example, acetone, methyl ethyl ketone, methyl isobutyl ketone, cyclohexanone, or the like. The aromatic solvent may be, for example, benzene, toluene, xylene, or the like. The amide solvent may be, for example, formamide, dimethylformamide, or the like. The alcohol solvent may be, for example, methanol, ethanol, n-propanol, isopropanol, n-butanol, isobutanol, s-butanol, t-butanol, diacetone alcohol, 2-methyl-2-butanol, or the like. Among these solvents, a ketone solvent and an ester solvent are preferred since they can be used for producing a solid-state image sensor filter. The above polymerization solvents may be used singly or in combination of two or more.

The amount of polymerization solvent used in the radical polymerization is not specifically limited. However, when the total amount of the monomers is set to 100 parts by weight, the amount of polymerization solvent used is preferably 1 part by weight or more and 1,000 parts by weight or less, and more preferably 10 parts by weight or more and 500 parts by weight or less.

Examples of the radical polymerization initiator include peroxides and azo compounds. The peroxide may be, for example, benzoyl peroxide, t-butyl peroxyacetate, t-butyl peroxybenzoate, di-t-butyl peroxide, or the like. The azo compound may be, for example, azobisisobutyronitrile, an azobisamidinopropane salt, azobiscyanovaleric acid (salt), 2,2'-azobis[2-methyl-N-(2-hydroxyethyl)propionamide], or the like.

When the total amount of monomers is set to 100 parts by weight, the amount of radical polymerization initiator used is preferably 0.0001 parts by weight or more and 20 parts by weight or less, more preferably 0.001 parts by weight or more and 15 parts by weight or less, and still more preferably 0.005 parts by weight or more and 10 parts by weight or less. The radical polymerization initiator may be added to the monomer and the polymerization solvent before the start of polymerization or may be added dropwise during the polymerization reaction. Adding the radical polymerization initiator dropwise to the monomer and the polymerization solvent during polymerization reaction is preferred since this prevents heat generation due to the polymerization.

The reaction temperature of the radical polymerization is appropriately selected depending on the type of the radical polymerization initiator and the polymerization solvent. The reaction temperature is preferably 60° C. or higher and 110° C. or lower from the viewpoint of ease of production and reaction controllability.

The copolymer may contain an additive having a radical scavenging ability. Since radicals are also captured by the additive, the copolymer and the additive can prevent the cyanine dye from being decomposed or denatured by radicals. Thus, the infrared cut-off filter 13 can be further prevented from being deteriorated by heating. The additive preferably has heat resistance of 250° C. or higher, and may contain, for example, an N-nitrosophenylhydroxylamine aluminum salt.

The glass transition temperature of the copolymer is preferably 75° C. or higher, and more preferably 100° C. or higher. Due to the glass transition temperature being 75° C. or higher, it is possible to reliably suppress the change in infrared light transmittance of the infrared cut-off filter when the infrared cut-off filter 13 is heated.

The molecular weight of the copolymer is preferably 30,000 or more and 150,000 or less, and more preferably 50,000 or more and 150,000 or less. Due to the molecular weight of the copolymer being within the above ranges, it is possible to reliably suppress the change in infrared light transmittance when the infrared cut-off filter 13 is heated.

When the molecular weight of the copolymer is more than 150,000, a solution obtained after polymerization has high viscosity. It is difficult to form a coating liquid containing such a copolymer and the cyanine dye. Therefore, when the molecular weight of the copolymer is more than 150,000, it is difficult to produce the infrared cut-off filter 13. On the other hand, when the molecular weight of the copolymer is 150,000 or less, it is possible to prepare a coating liquid containing the copolymer and the cyanine dye. Accordingly, the infrared cut-off filter 13 can be more easily produced. Further, an average molecular weight of the copolymer is a weight average molecular weight. The weight average molecular weight of the copolymer can be measured by, for example, gel permeation chromatography. The molecular weight of the copolymer can be controlled by, for example, changing the concentration of the monomer and the radical polymerization initiator in the solution in a radical polymerization reaction.

The percentage ($MM/MS \times 100$) of the weight of the monomer (MM) to the sum of the weight of the copolymer and the weight of the monomer constituting the copolymer, that is, the residual monomer not contained in the copolymer among the monomers used for forming the copolymer (MS), is preferably 20% or less. This makes the infrared light transmittance of the cyanine dye less likely to change when the infrared cut-off filter 13 is heated compared with the case where the residual monomer is more than 20%.

Further, the percentage ((MM/MS)×100) of the weight of the monomer (MM) to the sum of the weight of the copolymer and the weight of the monomer (MS) is more preferably 10% or less, and still more preferably 3% or less. The weight of the copolymer and the weight of the monomer can be quantified from the result of analysis of the copolymer. The copolymer may be analyzed by, for example, gas chromatography-mass spectrometry (GC-MS), nuclear magnetic resonance spectroscopy (NMR), infrared spectroscopy (IR), or the like.

The ratio of the weight of the monomer to the sum of the weight of the copolymer and the weight of the monomer may be changed by, for example, changing the polymerization time, changing the polymerization temperature, or the like. Further, the ratio of the weight of the monomer to the sum of the weight of the copolymer and the weight of the monomer may also be changed by changing the concentration of the monomer and the radical polymerization initiator at the start of polymerization reaction. The ratio of the weight of the monomer to the sum of the weight of the copolymer and the weight of the monomer may also be changed by changing the purification conditions after polymerization reaction. Particularly, changing the polymerization time is preferred since the ratio of the weight of the monomer can be changed with high accuracy.

<Method for Producing Solid-State Image Sensor Filter>

A method for producing a solid-state image sensor filter 10F includes the steps of forming an infrared cut-off filter 13, and patterning the infrared cut-off filter 13 by dry etching. The step of forming the infrared cut-off filter 13 includes forming the infrared cut-off filter 13 containing a cyanine dye and a copolymer. The method for producing the solid-state image sensor filter 10F will be described in detail below.

Filters 12R, 12G, 12B and 12P for respective colors are formed by forming a coating film containing a coloring photosensitive resin, and patterning the coating film by photolithography. For example, a coating film containing a red photosensitive resin is formed by applying a coating liquid containing a red photosensitive resin and drying the coating film. The red filter 12R is formed by exposure and development of the coating film containing a red photosensitive resin in a region corresponding to the red filter 12R. The green filter 12G, the blue filter 12B, and the infrared pass filter 12P are also formed by the same manner as for the red filter 12R.

The coloring compositions for the red filter 12R, the green filter 12G, and the blue filter 12B may include organic or inorganic pigments, and these pigments can be used singly or in combination of two or more. Pigments having high color development and high heat resistance, particularly having high resistance to thermal decomposition are preferred. Further, organic pigments are preferred. Examples of the organic pigments include phthalocyanine-based pigments, azo-based pigments, anthraquinone-based pigments, quinacridone-based pigments, dioxazine-based pigments, anthanthrone-based pigments, indanthrone-based pigments, perylene-based pigments, thioindigo-based pigments, isoindoline-based pigments, quinophthalone-based pigments, and diketopyrrolopyrrole-based pigment.

Further, a coloring component contained in the infrared pass filter 12P may be a black colorant or a black dye. The black colorant may be a single colorant producing black, or a mixture of two or more colorants producing black. Examples of black dyes include azo-based dyes, anthraquinone-based dyes, azine-based dyes, quinoline-based dyes, perinone-based dyes, perylene-based dyes, and methine-based dyes.

The photosensitive coloring composition for each color further contains a binder resin, a photopolymerization initiator, a polymerizable monomer, an organic solvent, a leveling agent, and the like.

The infrared cut-off filter 13 is formed by applying a coating liquid containing the above cyanine dye, the copolymer containing a first repeating unit and a second repeating unit, and the organic solvent to the filters 12R, 12G, 12B and 12P for respective colors. The coating film is dried by pre-baking. Then, the dried coating film is thermally cured by post-baking. Thus, the infrared cut-off filter 13 is formed.

For forming a through-hole 13H in the infrared cut-off filter 13, a photoresist layer is first formed on the infrared cut-off filter 13. The photoresist layer is patterned to form a resist pattern. Next, the infrared cut-off filter 13 is etched by dry etching using the resist pattern as an etching mask. The resist pattern left on the infrared cut-off filter 13 after etching is then removed using a stripping solution to form a through-hole 13H. Thus, the infrared cut-off filter is patterned.

As the stripping solution, a liquid capable of dissolving the resist pattern can be used. The stripping solution may be, for example, N-methylpyrrolidone or dimethyl sulfoxide. The infrared cut-off filter 13 can be exposed to the stripping solution by dipping, spraying, spinning, or other methods. Since the infrared cut-off filter 13 contains a copolymer having a crosslinked structure, it is possible to satisfy the resistance to the stripping solution and the heat resistance.

A barrier layer 14 is formed by film formation using a vapor phase film formation method such as sputtering, CVD or ion plating, or a liquid phase film formation method such as coating. The barrier layer 14 made of a silicon oxide may be formed by, for example, forming a film by sputtering using a target made of silicon oxide on a substrate on which the infrared cut-off filter 13 is formed. The barrier layer 14 made of a silicon oxide may be formed by, for example, forming a film by CVD using silane and oxygen on a substrate on which the infrared cut-off filter 13 is formed. The barrier layer 14 made of a silicon oxide may be formed by, for example, applying a coating liquid containing a polysilazane, modifying, and drying the coating film. The layer structure of the barrier layer 14 may be a single-layer structure made of a single compound, a laminate structure composed of layers made of a single compound, or a laminate structure composed of layers made of compounds different from each other.

The microlenses 15R, 15G, 15B and 15P are formed by forming a coating film containing a transparent resin, patterning the coating film by photolithography, and performing reflow by heat treatment. Examples of the transparent resin include acrylic resin, polyamide-based resin, polyimide-based resin, polyurethane-based resin, polyester-based resin, polyether-based resin, polyolefin-based resin, polycarbonate-based resin, polystyrene-based resin, and norbornene-based resin.

Preparation Example 1

Referring to Table 1, Preparation Example 1 of a polymer for producing an infrared cut-off filter will be described. When the polymer is a copolymer produced using two or more types of monomers, the weight ratio of the repeating units derived from the monomers in the produced copolymer is equal to the weight ratio of the monomers before production of the copolymer.

TABLE 1

| | Monomer | | Amount used (parts by weight) | |
|---|---|---|---|---|
| | 1 | 2 | 1 | 2 |
| Preparation Example 1-1 | PhMA | HPMA | 80 | 20 |
| Preparation Example 1-2 | PhMA | HPMAA | 80 | 20 |
| Preparation Example 1-3 | PhMA | 4-hydroxyphenyl maleimide | 80 | 20 |
| Preparation Example 1-4 | PhMA | α-methyl-p-hydroxystyrene | 80 | 20 |
| Preparation Example 1-5 | PhMA | — | 100 | — |

Preparation Example 1-1

150 parts by weight of propylene glycol monomethyl ether acetate (PGMAc) was prepared as a polymerization solvent, and 80 parts by weight of phenyl methacrylate (PhMA) ($C_{10}H_{10}O_2$) and 20 parts by weight of 4-hydroxyphenyl methacrylate (HPMA) ($C_{10}H_{10}O_3$) were prepared as monomers. Further, 1.5 parts by weight of benzoyl peroxide (BPO) was prepared as a radical polymer. These were placed in a reaction vessel having a stirring device and a reflux tube, and then stirred and refluxed for 8 hours while being heated to 80° C. with nitrogen gas being introduced into the reaction vessel. Thus, a polymer solution containing a copolymer formed from phenyl methacrylate and 4-hydroxyphenyl methacrylate was obtained.

Preparation Example 1-2

A polymer solution containing a copolymer formed from phenyl methacrylate and 4-hydroxyphenyl methacrylamide was obtained in the same manner as in Preparation Example 1-1 except that the 4-hydroxyphenyl methacrylate in Preparation Example 1-1 was changed to 4-hydroxyphenyl methacrylamide (HPMAA) ($C_{10}H_{11}NO_2$).

Preparation Example 1-3

A polymer solution containing a copolymer formed from phenyl methacrylate and 4-hydroxyphenyl maleimide was obtained in the same manner as in Preparation Example 1-1 except that the 4-hydroxyphenyl methacrylate in Preparation Example 1-1 was changed to 4-hydroxyphenyl maleimide ($C_{10}H_7NO_3$).

Preparation Example 1-4

A polymer solution containing a copolymer formed from phenyl methacrylate and α-methyl-p-hydroxystyrene was obtained in the same manner as in Preparation Example 1-1 except that the 4-hydroxyphenyl methacrylate in Preparation Example 1-1 was changed to α-methyl-p-hydroxystyrene ($C_9H_{10}O$).

Preparation Example 1-5

A polymer solution containing a homopolymer formed from phenyl methacrylate was obtained in the same manner as in Preparation Example 1-1 except that 100 parts by weight of phenyl methacrylate alone in Preparation Example 1-1 was prepared as a monomer.

Test Example 1

Referring to Table 2, Test Example 1 will be described.

Five types of infrared cut-off filters were obtained using the polymers of Preparation Example 1-1 to Preparation Example 1-5 by the method described below. The transmittance of each infrared cut-off filter before and after the heat resistance test was measured by the method described below.

A coating liquid containing 0.3 g of cyanine dye, 12.5 g of a 25% polymer solution, and 10 g of propylene glycol monomethyl ether acetate was prepared. The dye used was the cyanine dye represented by the above formula (5), and five types of polymer solutions including the copolymers obtained in the above Preparation Example 1-1 to Preparation Example 1-5, respectively, were used. The coating liquid was applied to the transparent substrate, and the coating film was dried. Then, the coating film was heated to 230° C. and cured to obtain infrared cut-off filters of Test Example 1-1 to Test Example 1-5 having a thickness of 1.0 μm.

<Evaluation Method>

(Spectral Characteristics)

A transmittance of the infrared cut-off filter of each test example for light with a wavelength of 350 nm to 1150 nm was measured using a spectrophotometer (U-4100, manufactured by Hitachi High-Technologies Corporation). Thus, a transmittance spectrum of each infrared cut-off filter was obtained. The transmittance spectrum of the cyanine dye represented by the above formula (5) has a minimum value at 950 nm. Therefore, the transmittance % T at 950 nm of each infrared cut-off filter before and after the heat resistance test was calculated.

(Heat Resistance Test)

After the transmittance of the infrared cut-off filter of each test example was measured, the infrared cut-off filter of each test example was heated to 250° C. The transmittance of the infrared cut-off filter of each test example after heating was calculated in the same manner as that performed for the infrared cut-off filter of each test example before heating.

(Amount of Change in Transmittance)

For each test example, the amount of change in transmittance % T was calculated by subtracting the transmittance % T at 950 nm before the heat resistance test from the transmittance % T at 950 nm after the heat resistance test.

<Evaluation Results>

Table 2 shows the transmittance % T before the heat resistance test, the transmittance % T after the heat resistance test and the amount of change in transmittance % T for each test example.

TABLE 2

| | Before heat resistance test (% T) | After heat resistance test (% T) | Amount of change (% T) |
|---|---|---|---|
| Test Example 1-1 | 10 | 15 | 5 |
| Test Example 1-2 | 10 | 15 | 5 |
| Test Example 1-3 | 10 | 15 | 5 |
| Test Example 1-4 | 10 | 15 | 5 |
| Test Example 1-5 | 10 | 45 | 35 |

As shown in Table 2, the transmittance % T at 950 nm before the heat resistance test was found to be 10% T in the infrared cut-off filters of Test Example 1-1 to Test Example 1-5. Further, the transmittance % T at 950 nm after the heat resistance test was found to be 15% T in the infrared cut-off filters of Test Example 1-1 to Test Example 1-4. On the other hand, the transmittance % T at 950 nm after the heat resistance test was found to be 45% T in the infrared cut-off filter of Test Example 1-5. As seen from above, when the polymer contained in the infrared cut-off filter includes a second repeating unit derived from phenyl methacrylate, the heat resistance of the infrared cut-off filter was found to be enhanced due to the presence of the first repeating unit derived from the monomer having a phenolic hydroxyl group.

Preparation Example 2

Referring to Table 3, Preparation Example 2 of a polymer for producing an infrared cut-off filter will be described.

TABLE 3

| | Monomer | | Amount used (parts by weight) | |
|---|---|---|---|---|
| | 1 | 2 | 1 | 2 |
| Preparation Example 2-1 | PhMA | HPMA | 80 | 20 |
| Preparation Example 2-2 | BPMA | HPMA | 80 | 20 |
| Preparation Example 2-3 | DCPMA | HPMA | 80 | 20 |
| Preparation Example 2-4 | CHMA | HPMA | 80 | 20 |
| Preparation Example 2-5 | PhMA | — | 100 | — |
| Preparation Example 2-6 | BPMA | — | 100 | — |
| Preparation Example 2-7 | DCPMA | — | 100 | — |
| Preparation Example 2-8 | CHMA | — | 100 | — |

Preparation Example 2-1

A polymer solution of Preparation Example 2-1 was obtained in the same manner as in Preparation Example 1-1.

Preparation Example 2-2

A polymer solution containing a copolymer formed from 4-biphenyl methacrylate and 4-hydroxyphenyl methacrylate was obtained in the same manner as in Preparation Example 2-1 except that the phenyl methacrylate in Preparation Example 2-1 was changed to 4-biphenyl methacrylate (BPMA) ($C_{16}H_{14}O_2$).

Preparation Example 2-3

A polymer solution containing a copolymer formed from dicyclopentanyl methacrylate and 4-hydroxyphenyl methacrylate was obtained in the same manner as in Preparation Example 2-1 except that the phenyl methacrylate in Preparation Example 2-1 was changed to dicyclopentanyl methacrylate (DCPMA) ($C_{14}H_{20}O_2$).

Preparation Example 2-4

A polymer solution containing a copolymer formed from cyclohexyl methacrylate and 4-hydroxyphenyl methacrylate was obtained in the same manner as in Preparation Example 2-1 except that the phenyl methacrylate in Preparation Example 2-1 was changed to cyclohexyl methacrylate (CHMA) ($C_{10}H_{16}O_2$).

Preparation Example 2-5

A polymer solution containing a homopolymer formed from phenyl methacrylate was obtained in the same manner as in Preparation Example 2-1 except that 100 parts by weight of phenyl methacrylate alone in Preparation Example 2-1 was prepared as a monomer.

Preparation Example 2-6

A polymer solution containing a homopolymer formed from 4-biphenyl methacrylate was obtained in the same manner as in Preparation Example 2-2 except that 100 parts by weight of 4-biphenyl methacrylate (BPMA) alone in Preparation Example 2-2 was prepared as a monomer.

Preparation Example 2-7

A polymer solution containing a homopolymer formed from dicyclopentanyl methacrylate was obtained in the same manner as in Preparation Example 2-3 except that 100 parts by weight of dicyclopentanyl methacrylate alone in Preparation Example 2-3 was prepared as a monomer.

Preparation Example 2-8

A polymer solution containing a homopolymer formed from cyclohexyl methacrylate was obtained in the same manner as in Preparation Example 2-4 except that 100 parts by weight of cyclohexyl methacrylate alone in Preparation Example 2-4 was prepared as a monomer.

Test Example 2

Referring to Table 4, Test Example 2 will be described.

Eight types of infrared cut-off filters were obtained using the polymers of Preparation Example 2-1 to Preparation Example 2-8 in the same manner as in Test Example 1. The transmittance % T of each infrared cut-off filter before and after the heat resistance test was calculated in the same manner as in Test Example 1.

<Evaluation Results>

Table 4 shows the transmittance % T before the heat resistance test, the transmittance % T after the heat resistance test and the amount of change in transmittance % T for each test example.

TABLE 4

| | Before heat resistance test (% T) | After heat resistance test (% T) | Amount of change (% T) |
|---|---|---|---|
| Test Example 2-1 | 10 | 15 | 5 |
| Test Example 2-2 | 10 | 15 | 5 |
| Test Example 2-3 | 10 | 15 | 5 |
| Test Example 2-4 | 10 | 15 | 5 |
| Test Example 2-5 | 10 | 45 | 35 |
| Test Example 2-6 | 10 | 40 | 30 |
| Test Example 2-7 | 10 | 80 | 70 |
| Test Example 2-8 | 10 | 70 | 60 |

As shown in Table 4, the transmittance % T at 950 nm before the heat resistance test was found to be 10% T in the infrared cut-off filters of Test Example 2-1 to Test Example 2-8. Further, the transmittance % T at 950 nm after the heat resistance test was found to be 15% T in the infrared cut-off filters of Test Example 2-1 to Test Example 2-4. On the other hand, the transmittance % T at 950 nm after the heat resistance test was found to be 45% T in the infrared cut-off filter of Test Example 2-5, 40% T in the infrared cut-off filter of Test Example 2-6, 80% T in the infrared cut-off filter in Test Example 2-7, and 70% T in the infrared cut-off filter in Test Example 2-8.

As seen from the above, when containing the first repeating unit derived from 4-hydroxyphenyl methacrylate, the heat resistance of the infrared cut-off filter was found to be enhanced compared with the case where the first repeating unit is not contained, regardless of whether the second repeating unit is derived from any of the above-mentioned four types of monomers.

Preparation Example 3

Referring to Table 5, Preparation Example 3 of a polymer for producing an infrared cut-off filter will be described.

TABLE 5

| | Monomer | | Amount used (parts by weight) | |
|---|---|---|---|---|
| | 1 | 2 | 1 | 2 |
| Preparation Example 3-1 | PhMA | HPMA | 90 | 10 |
| Preparation Example 3-2 | PhMA | HPMA | 80 | 20 |
| Preparation Example 3-3 | PhMA | HPMA | 70 | 30 |
| Preparation Example 3-4 | PhMA | HPMA | 60 | 40 |

Preparation Example 3-1

A polymer solution containing a copolymer formed from phenyl methacrylate and 4-hydroxyphenyl methacrylate was obtained in the same manner as in Preparation Example 1-1 except that 90 parts by weight of phenyl methacrylate and 10 parts by weight of 4-hydroxyphenyl methacrylate were prepared as monomers in Preparation Example 1-1.

Preparation Example 3-2

A polymer solution of Preparation Example 3-2 was obtained in the same manner as in Preparation Example 1-1.

Preparation Example 3-3

A polymer solution containing a copolymer formed from phenyl methacrylate and 4-hydroxyphenyl methacrylate was obtained in the same manner as in Preparation Example 3-1 except that 70 parts by weight of phenyl methacrylate and 30 parts by weight of 4-hydroxyphenyl methacrylate were prepared as monomers in Preparation Example 3-1.

Preparation Example 3-4

A polymer solution containing a copolymer formed from phenyl methacrylate and 4-hydroxyphenyl methacrylate was obtained in the same manner as in Preparation Example 3-1 except that 60 parts by weight of phenyl methacrylate and 40 parts by weight of 4-hydroxyphenyl methacrylate were prepared as monomers in Preparation Example 3-1.

Test Example 3

Referring to Table 6, Test Example 3 will be described.

Four types of infrared cut-off filters were obtained using the polymers of Test Example 3-1 to Test Example 3-4 in the same manner as in Test Example 1. The transmittance % T of each infrared cut-off filter before and after the heat resistance test was calculated in the same manner as in Test Example 1.

<Evaluation Results>

Table 6 shows the transmittance % T before the heat resistance test, the transmittance % T after the heat resistance test and the amount of change in transmittance % T for each test example.

TABLE 6

| | Before heat resistance test (% T) | After heat resistance test (% T) | Amount of change (% T) |
|---|---|---|---|
| Test Example 3-1 | 10 | 15 | 5 |
| Test Example 3-2 | 10 | 15 | 5 |
| Test Example 3-3 | 10 | 17 | 7 |
| Test Example 3-4 | 25 | 50 | 25 |

As shown in Table 6, the transmittance % T at 950 nm before the heat resistance test was found to be 10% T in the infrared cut-off filters of Test Example 3-1 to Test Example 3-3. On the other hand, the transmittance % T at 950 nm before the heat resistance test was found to be 25% T in the infrared cut-off filter of Test Example 3-4.

Further, the transmittance % T at 950 nm after the heat resistance test was found to be 15% in the infrared cut-off filters of Test Example 3-1 and Test Example 3-2, 17% T in the infrared cut-off filters of Test Example 3-3, and 50% T in the infrared cut-off filters of Test Example 3-4.

From the above results, in the copolymer composed of the first repeating unit derived from 4-hydroxyphenyl methacrylate and the second repeating unit derived from phenyl methacrylate, the transmittance % T at 950 nm before the heat resistance test was found to be low, and the amount of change in transmittance % T was found to be small when the content of first repeating unit was 10 wt. % or more and 30 wt. % or less.

Preparation Example 4

Referring to Table 7, Preparation Example 4 of a polymer for producing an infrared cut-off filter will be described.

TABLE 7

| | Monomer | | | Amount used (parts by weight) | | |
|---|---|---|---|---|---|---|
| | 1 | 2 | 3 | 1 | 2 | 3 |
| Preparation Example 4-1 | PhMA | HPMA | GMA | 90 | 5 | 5 |
| Preparation Example 4-2 | PhMA | HPMA | GMA | 80 | 10 | 10 |
| Preparation Example 4-3 | PhMA | HPMA | GMA | 70 | 15 | 15 |

TABLE 7-continued

| | Monomer | | | Amount used (parts by weight) | | |
|---|---|---|---|---|---|---|
| | 1 | 2 | 3 | 1 | 2 | 3 |
| Preparation Example 4-4 | PhMA | HPMA | GMA | 60 | 20 | 20 |
| Preparation Example 4-5 | PhMA | HPMA | GMA | 70 | 20 | 10 |
| Preparation Example 4-6 | PhMA | HPMA | GMA | 70 | 10 | 20 |
| Preparation Example 4-7 | PhMA | HPMA | GMA | 70 | 5 | 25 |

Preparation Example 4-1

90 parts by weight of phenyl methacrylate, 5 parts by weight of 4-hydroxyphenyl methacrylate and 5 parts by weight of glycidyl methacrylate (GMA) ($C_7H_{10}O_3$) were prepared as monomers. A polymer solution containing a copolymer formed of phenyl methacrylate, 4-hydroxyphenyl methacrylate and glycidyl methacrylate was obtained in the same manner as in Preparation Example 1-1.

Preparation Example 4-2

80 parts by weight of phenyl methacrylate, 10 parts by weight of 4-hydroxyphenyl methacrylate and 10 parts by weight of glycidyl methacrylate were prepared as monomers. A polymer solution containing a copolymer formed of phenyl methacrylate, 4-hydroxyphenyl methacrylate and glycidyl methacrylate was obtained in the same manner as in Preparation Example 4-1.

Preparation Example 4-3

70 parts by weight of phenyl methacrylate, 15 parts by weight of 4-hydroxyphenyl methacrylate and 15 parts by weight of glycidyl methacrylate were prepared as monomers. A polymer solution containing a copolymer formed of phenyl methacrylate, 4-hydroxyphenyl methacrylate and glycidyl methacrylate was obtained in the same manner as in Preparation Example 4-1.

Preparation Example 4-4

60 parts by weight of phenyl methacrylate, 20 parts by weight of 4-hydroxyphenyl methacrylate and 20 parts by weight of glycidyl methacrylate were prepared as monomers. A polymer solution containing a copolymer formed of phenyl methacrylate, 4-hydroxyphenyl methacrylate and glycidyl methacrylate was obtained in the same manner as in Preparation Example 4-1.

Preparation Example 4-5

70 parts by weight of phenyl methacrylate, 20 parts by weight of 4-hydroxyphenyl methacrylate and 10 parts by weight of glycidyl methacrylate were prepared as monomers. A polymer solution containing a copolymer formed of phenyl methacrylate, 4-hydroxyphenyl methacrylate and glycidyl methacrylate was obtained in the same manner as in Preparation Example 4-1.

Preparation Example 4-6

70 parts by weight of phenyl methacrylate, 10 parts by weight of 4-hydroxyphenyl methacrylate and 20 parts by weight of glycidyl methacrylate were prepared as monomers. A polymer solution containing a copolymer formed of phenyl methacrylate, 4-hydroxyphenyl methacrylate and glycidyl methacrylate was obtained in the same manner as in Preparation Example 4-1.

Preparation Example 4-7

70 parts by weight of phenyl methacrylate, 5 parts by weight of 4-hydroxyphenyl methacrylate and 25 parts by weight of glycidyl methacrylate were prepared as monomers. A polymer solution containing a copolymer formed of phenyl methacrylate, 4-hydroxyphenyl methacrylate and glycidyl methacrylate was obtained in the same manner as in Preparation Example 4-1.

Test Example 4

Referring to Table 8, Test Example 4 will be described.

Seven types of infrared cut-off filters were obtained using the copolymers of Preparation Example 4-1 to Preparation Example 4-7 in the same manner as in Test Example 1. The transmittance % T of each infrared cut-off filter before and after the heat resistance test was calculated in the same manner as in Test Example 1.

<Evaluation Results>

Table 8 shows the transmittance % T before the heat resistance test, the transmittance % T after the heat resistance test and the amount of change in transmittance % T for each test example.

TABLE 8

| | Before heat resistance test (% T) | After heat resistance test (% T) | Amount of change (% T) |
|---|---|---|---|
| Test Example 4-1 | 10 | 15 | 5 |
| Test Example 4-2 | 10 | 15 | 5 |
| Test Example 4-3 | 10 | 15 | 5 |
| Test Example 4-4 | 20 | 40 | 20 |
| Test Example 4-5 | 10 | 15 | 5 |
| Test Example 4-6 | 10 | 15 | 5 |
| Test Example 4-7 | 10 | 20 | 10 |

As shown in Table 8, the transmittance % T at 950 nm before the heat resistance test was found to be 10% T in the infrared cut-off filters of Test Example 4-1 to Test Example 4-3 and Test Example 4-5 to Test Example 4-7. On the other hand, the transmittance % T at 950 nm before the heat resistance test was found to be 20% T in the infrared cut-off filter of Test Example 4-4.

Further, the transmittance % T at 950 nm after the heat resistance test was found to be 15% T in the infrared cut-off filters of Test Example 4-1 to Test Example 4-3, Test Example 4-5 and Test Example 4-6. On the other hand, the transmittance % T at 950 nm after the heat resistance test was found to be 40% T in the infrared cut-off filter of Test Example 4-4, and 20% T in the infrared cut-off filter of Test Example 4-7.

From the above results, it is found that the copolymer formed from phenyl methacrylate, 4-hydroxyphenyl methacrylate and glycidyl methacrylate preferably satisfies the following conditions.

(Condition 1) The content of the second repeating unit derived from phenyl methacrylate is 70 wt. % or more.

(Condition 2) The content of the repeating unit derived from glycidyl methacrylate is 5 wt. % or more and 20 wt. % or less.

(Condition 3) The ratio (WH/WG) of the weight of 4-hydroxyphenyl methacrylate (WH) to the weight of glycidyl methacrylate (WG) is 0.5 or more.

Test Example 5

An infrared cut-off filter of Test Example 5-1 was obtained in the same manner as in Test Example 1 except that a polymer solution of Preparation Example 3-1 was used and 0.3 mg of N-nitrosophenylhydroxylamine aluminum salt was added as an additive in Test Example 1. Further, an infrared cut-off filter of Test Example 5-2 was obtained in the same manner as in Test Example 1 except that a polymer solution of Preparation Example 3-1 was used in Test Example 1. The transmittance % T of each infrared cut-off filter before and after the heat resistance test was calculated in the same manner as in Test Example 1.

<Evaluation Results>

Table 9 shows the transmittance % T before the heat resistance test, the transmittance % T after the heat resistance test and the amount of change in transmittance % T for each test example.

TABLE 9

| | Additive | Before heat resistance test (% T) | After heat resistance test (% T) | Amount of change (% T) |
|---|---|---|---|---|
| Test Example 5-1 | Yes | 10 | 13 | 3 |
| Test Example 5-2 | No | 10 | 15 | 5 |

As shown in Table 9, the transmittance % T at 950 nm before the heat resistance test was found to be 10% T in the infrared cut-off filters of Test Example 5-1 and Test Example 5-2. Further, the transmittance % T at 950 nm after the heat resistance test was found to be 13% T in the infrared cut-off filter of Test Example 5-1, and 15% T in the infrared cut-off filter of Test Example 5-2.

As seen from above, the heat resistance of the infrared cut-off filter was found to be further enhanced by adding the N-nitrosophenylhydroxylamine aluminum salt to the coating film for forming the infrared cut-off filter.

As described above, according to the first embodiment of the infrared cut-off filter, the solid-state image sensor filter, the solid-state image sensor, and the method for producing a solid-state image sensor filter, the following advantageous effects can be obtained.

(1-1) The copolymer having the first repeating unit captures radicals. Therefore, even when the infrared cut-off filter 13 contains a radical polymerization initiator, the copolymer containing the first repeating unit and the second repeating unit can prevent the cyanine dye from being decomposed or denatured by radicals. Thus, the infrared cut-off filter 13 can be prevented from being deteriorated by heating.

(1-2) Due to the copolymer containing the second repeating unit derived from the monomer having an aromatic ring or an alicyclic structure, it is possible to prevent the transmittance of the infrared cut-off filter from increasing at the time of production of the infrared cut-off filter 13.

(1-3) It is possible to prevent the transmittance of the infrared cut-off filter 13 from decreasing at the time of production of the infrared cut-off filter 13, and prevent the infrared cut-off filter from being deteriorated by heating.

(1-4) When the infrared cut-off filter is produced using a copolymer having the third repeating unit, the infrared cut-off filter has enhanced heat resistance.

(1-5) Due to the glass transition temperature being 75° C. or higher, it is possible to reliably suppress the change in infrared light transmittance of the infrared cut-off filter when the infrared cut-off filter 13 is heated.

(1-6) Due to the molecular weight of the copolymer being within the range of 30,000 or more and 150,000 or less, it is possible to reliably suppress change in infrared light transmittance when the infrared cut-off filter 13 is heated.

(1-7) Since the residual monomer is 20% or less, the infrared light transmittance of the cyanine dye is less likely to change when the infrared cut-off filter is heated compared with the case where the residual monomer is more than 20%.

(1-8) Even when the infrared cut-off filter contains a radical polymerization initiator, the infrared cut-off filter is prevented from being deteriorated by radicals since the additive captures radicals generated by heating the infrared cut-off filter.

(1-9) Since the barrier layer 14 prevents an oxidation source from passing therethrough toward the infrared cut-off filter 13, the infrared cut-off filter 13 has enhanced light resistance.

Modifications of First Embodiment

The above embodiment can be modified and implemented as below.

(Copolymer)

The copolymer may contain more than 30 wt. % of a first repeating unit.

The copolymer may not necessarily contain a third repeating unit derived from glycidyl methacrylate. Alternatively, the content of the third repeating unit contained in the copolymer may be smaller than 5 wt. %. In this case as well, the effect similar to the above (1-1) can be obtained as long as the copolymer contains the first repeating unit and the second repeating unit.

(Additive)

The infrared cut-off filter 13 may not necessarily contain an additive having a radical scavenging ability. In this case as well, the effect similar to the above (1-1) can be obtained as long as the copolymer contains the first repeating unit and the second repeating unit. The additive having a radical scavenging ability may be, for example, an N-nitrosophenylhydroxylamine aluminum salt described above.

(Barrier Layer)

The barrier layer 14 may not necessarily be disposed between the infrared cut-off filter 13 and each of the microlenses 15R, 15G, 15B and 15P, but may also be disposed on the outer surface of the microlenses 15R, 15G, 15B and 15P.

The solid-state image sensor filter 10F may not necessarily include the barrier layer 14. In this case as well, the effect similar to the above (1-1) can be obtained. When the barrier layer 14 is omitted, a laminate structure located on a side of the infrared cut-off filter 13 on which the light-incident surface 15S is located may have an oxygen transmission rate of 5.0 cc/m$^2$/day/atm or less. For example, the laminate structure may be another functional layer such as a planarization layer or an adhesion layer. The laminate structure together with the microlenses may have an oxygen transmission rate of 5.0 cc/m$^2$/day/atm or less.

The solid-state image sensor 10 may include an anchor layer between the barrier layer 14 and a layer underlying the barrier layer 14. In this case, the anchor layer enhances adhesion between the barrier layer 14 and the layer underlying the barrier layer 14. Further, the solid-state image sensor 10 may include an anchor layer between the barrier layer 14 and a layer overlying the barrier layer 14. In this case, the anchor layer enhances adhesion between the barrier layer and the layer overlying the barrier layer. A material constituting the anchor layer may be, for example, a polyfunctional acrylic resin or a silane coupling agent. The thickness of the anchor layer may be, for example, 50 nm or more and 1 μm or less. When the anchor layer has a thickness of 50 nm or more, adhesion between layers can be obtained. When the anchor layer has a thickness of 1 μm or less, absorption of light by the anchor layer can be suppressed.

The layer structure of the barrier layer 14 may be a single-layer structure made of a single compound, a laminate structure composed of layers made of a single compound, or a laminate structure composed of layers made of compounds different from each other.

The barrier layer 14 may also function as a flattening layer that fills the step formed by the surface of the infrared cut-off filter 13 and the surface of the infrared pass filter 12P.

(Color Filter)

The thickness of the color filters 12R, 12G, and 12B may be the same as that of the infrared pass filter 12P or different from that of the infrared pass filter 12P. The thickness of the color filters 12R, 12G, and 12B may be, for example, 0.5 μm or more and 5 μm or less.

The color filters may be three color filters composed of a cyan filter, a yellow filter and a magenta filter. Further, the color filters may be four color filters composed of a cyan filter, a yellow filter, a magenta filter and a black filter. Further, the color filters may be four color filters composed of a transparent filter, a yellow filter, a red filter and a black filter.

The color filters 12R, 12G, and 12B may have a thickness which is the same as that of the infrared pass filter 12P or different from that of the infrared pass filter 12P. The thickness of the color filters 12R, 12G, and 12B may be, for example, 0.5 μm or more and 5 μm or less.

<Infrared Cut-Off Filter>

Materials constituting the infrared cut-off filter 13 can contain additives for imparting functions other than the function of absorbing infrared light, such as a photostabilizer, an antioxidant, a thermal stabilizer and an antistatic agent.

The infrared cut-off filter 13 may have a function as a microlens. In this case, the infrared cut-off filter 13 has a function of collecting light toward the photoelectric conversion element. Accordingly, the layer structure provided in the solid-state image sensor filter can be simplified.

(Others)

Materials constituting the infrared pass filter 12P can contain additives for imparting functions other than the function of absorbing visible light, such as a photostabilizer, an antioxidant, a thermal stabilizer and an antistatic agent.

The solid-state image sensor 10 may include a band-pass filter on a light-incident side of the plurality of microlenses. A band-pass filter is a filter that transmits only light having specific wavelengths of visible light and near-infrared light, and has a function similar to that of the infrared cut-off filter 13. That is, a band-pass filter can cut off unnecessary infrared light which may otherwise be detected by the respective color photoelectric conversion elements 1R, 11G and 11B. Accordingly, it is possible to improve the accuracy in detection of visible light by the respective color photoelectric conversion elements 1R, 11G and 11B, and detection of near-infrared light in the 850 nm or 940 nm wavelength band by the infrared photoelectric conversion element 11P.

Second Embodiment

A second embodiment of an infrared cut-off filter, a solid-state image sensor filter, a solid-state image sensor, and a method for producing a solid-state image sensor filter will be described. The infrared cut-off filter of the second embodiment differs from the infrared cut-off filter of the first embodiment in that it contains an organic peroxide having an aromatic ring and the content of the organic peroxide is less than 0.35 parts by weight relative to 100 parts by weight of the copolymer. Therefore, in the following description, the difference between the second embodiment and the first embodiment will be described in detail, while description common to the second embodiment and the first embodiment is omitted.

<Infrared Cut-Off Filter>

The infrared cut-off filter 13 contains a cyanine dye, an acrylic polymer, and an organic peroxide having an aromatic ring. The cyanine dye is a cyanine dye that can be used in the first embodiment.

The acrylic polymer is a polymer compound obtained by polymerizing monomers containing acrylic acid or methacrylic acid. The monomer containing acrylic acid is an acrylate, and the monomer containing methacrylic acid is a methacrylate. The acrylic polymer may be formed from a single monomer or may be a copolymer formed from two or more monomers.

The acrylic polymer preferably contains a repeating unit derived from a monomer having at least one of an aromatic ring, a phenolic hydroxyl group and a cyclic ether group. The acrylic polymer is more preferably a copolymer containing a repeating unit derived from a monomer having an aromatic ring, a repeating unit derived from a monomer having a phenolic hydroxyl group, and a repeating unit derived from a monomer having a cyclic ether group.

Examples of the monomer having an aromatic ring include the monomers having an aromatic ring described in the first embodiment. Examples of the monomer having a phenolic hydroxyl group include the monomers having a phenolic hydroxyl group described in the first embodiment. Examples of the monomer having a cyclic ether group include the monomers having a cyclic ether group described in the first embodiment.

The acrylic polymer preferably contains a fourth repeating unit derived from phenyl methacrylate represented by formula (48) below.

Chem. 48

Formula (48)

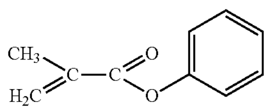

Since the acrylic polymer constituting the infrared cut-off filter 13 contains the fourth repeating unit derived from phenyl methacrylate, a phenyl group of the fourth repeating unit is located between cyanine dyes adjacent to each other. Accordingly, a distance sufficient to prevent occurrence of aggregation between cyanine dyes can be formed between the cyanine dyes. This prevents deterioration of spectral characteristics at the expected absorption wavelengths of the cyanine dye.

The acrylic polymer preferably contains a fifth repeating unit derived from 4-hydroxyphenyl methacrylate represented by formula (49) below.

Chem. 49

Formula (49)

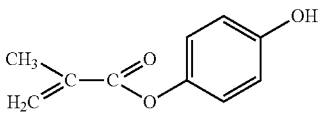

Further, the acrylic polymer preferably contains a sixth repeating unit derived from glycidyl methacrylate represented by formula (50) below.

Chem. 50

Formula (50)

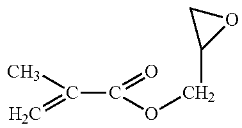

The phenolic hydroxyl group contained in the fifth repeating unit is crosslinked with the epoxy group of the sixth repeating unit to form a crosslinked structure. This prevents the absorbance of the infrared cut-off filter 13 from decreasing due to heating.

The acrylic polymer may be an acrylic copolymer formed from the fourth repeating unit, the fifth repeating unit and the sixth repeating unit, or may contain a unit structure derived from a monomer other than the monomers for forming the fourth repeating unit to the sixth repeating unit.

The acrylic polymer may contain a repeating unit derived from a monomer having an alicyclic structure. Examples of the monomer having an alicyclic structure include the monomers having an alicyclic structure described in the first embodiment.

The acrylic polymer may contain a repeating unit derived from a monomer other than the above acrylic monomers. Examples of the monomer other than the above acrylic monomers include the monomers described in the first embodiment. Further, the acrylic polymer may be polymerized with a monomer for adjusting the polarity of the acrylic polymer. Examples of the monomer for adjusting the polarity include the monomers for adjusting the polarity described in the first embodiment.

In the present embodiment, the polymerization initiator is a thermal polymerization initiator that generates radicals as active species by heating, that is, a thermal radical polymerization initiator. The polymerization initiator is at least one of an organic peroxide and an azo compound. The organic peroxide is a derivative of hydrogen peroxide ($H_2O_2$). The azo compound includes an azo group (—N═N—) that generates carbon radicals. In production of the acrylic polymer, a plurality of thermal polymerization initiators may be used in combination. By combining a plurality of thermal polymerization initiators, the polymerization rate can be controlled.

In the organic peroxide, a hydrogen atom in the hydrogen peroxide is substituted with an organic atomic group. The organic peroxide may contain, for example, at least one selected from the group consisting of hydroperoxide, dialkyl peroxide, diacyl oxide and peroxy ester. Examples of the organic peroxide having an aromatic ring include benzoyl peroxide (BPO), t-butyl peroxybenzoate, cumene hydroperoxide, diisopropylbenzene hydroperoxide, di(2-t-butylperoxyisopropyl) benzene, dicumyl peroxide, t-butyl cumyl peroxide, di-(3-methylbenzoyl) peroxide, benzoyl(3-methylbenzoyl) peroxide, cumyl peroxyneodecanoate, t-hexyl peroxybenzoate, 2,5-dimethyl-2,5-di(benzoyl peroxy) hexane, 3,3',4,4'-tetra(t-butyl peroxycarbonyl) benzophenone, and 2,3-dimethyl-2,3-diphenylbutane.

Examples of the organic peroxide containing no aromatic ring include dilauroyl peroxide, 1,1,3,3-tetramethylbutylperoxy-2-ethylhexanoate, t-hexylperoxy-ethylhexanoate, and t-butylperoxy-2-ethylhexanoate.

Examples of the azo compound include 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(4-methoxy-2,4-dimethylvaleronitrile), dimethyl 2,2'-azobis(2-methylpropionate), 2,2'-azobis(2-methylbutyronitrile), 1,1'-azobis(cyclohexane-1-carbonitrile), 2,2'-azobis(N-butyl-2-methylpropionamide), dimethyl 1,1'-azobis(1-cyclohexanecarboxylate), 1,1'-azobis (1-acetoxy-phenylethane), azobis amidinopropane salts, azobis cyanovaleric acid (salts), and 2,2'-azobis[2-methyl-N-(2-hydroxyethyl)propionamide].

Among the above thermal polymerization initiators, BPO and AIBN are preferred in that they can be easily applied to polymerization using an organic solvent since they can be used at a reaction temperature of 100° C. or less. Further, BPO is specifically preferred in that it is not likely to affect the absorption characteristics of the cyanine dye since it does not contain a nitrogen atom and thus does not interact with the cyanine dye containing a nitrogen atom.

Since the infrared cut-off filter 13 includes less than 0.35 parts by weight of the organic peroxide having an aromatic ring relative to 100 parts by weight of the acrylic polymer, it is possible to suppress deterioration of the spectral characteristics of the infrared cut-off filter in the visible light region and the infrared light region. When the infrared cut-off filter 13 is exposed to heat in mounting or use of the infrared cut-off filter 13, the organic peroxide having an aromatic ring remaining in the infrared cut-off filter 13 decomposes to produce a decomposition product having an aromatic ring. In such a decomposition product, the decomposition product itself has absorption at specific wavelengths of the visible light region or infrared light region, or a benzene ring which is a π-conjugated system contained in the decomposition product affects the absorption characteristics of the cyanine dye which is also a π-conjugated system. This may cause the infrared cut-off filter 13 to have an increase in absorption rate in the wavelengths of the visible light region or a decrease in absorption rate in the wavelengths of the infrared light region compared with the spectral characteristics of the coloring composition constituting the infrared cut-off filter 13. Such deterioration of the spectral characteristics deteriorates the expected spectral characteristics of the infrared cut-off filter 13.

In this regard, according to the above infrared cut-off filter 13, in which less than 0.35 parts by weight of the organic peroxide having an aromatic ring is contained relative to 100 parts by weight of the acrylic polymer, it is possible to prevent the spectral characteristics of the infrared cut-off filter 13 from deteriorating in both the visible light region and the infrared light region.

The amount of the organic peroxide having an aromatic ring in the infrared cut-off filter 13 can be adjusted according to, for example, the amount of the organic peroxide used in synthesis of the acrylic polymer. Further, the synthesized acrylic polymer can be purified or heated to decrease the amount of the organic peroxide in the infrared cut-off filter 13 compared with the case where no purification or heating is performed.

When the total amount of acrylic monomers is set to 100 parts by weight, the amount of polymerization initiator used is preferably 0.0001 parts by weight or more and 20 parts by weight or less, more preferably 0.001 parts by weight or more and 15 parts by weight or less, and still more preferably 0.005 parts by weight or more and 10 parts by weight or less. The polymerization initiator may be added to the acrylic monomer and the polymerization solvent before the polymerization is started or may be added dropwise during the polymerization reaction. Adding the polymerization initiator dropwise to the acrylic monomer and the polymerization solvent during polymerization reaction is preferred since this prevents heat generation due to the polymerization.

<Method for Producing Solid-State Image Sensor Filter>

The manufacturing method described in the first embodiment can be applied to the method for producing the solid-state image sensor filter. As described above, at least one of an azo compound as a thermal radical polymerization initiator and an organic peroxide is used for synthesis of the acrylic polymer. In synthesis of the acrylic polymer, it is preferred that less than 0.35 parts by weight of the organic peroxide is used during the polymerization, when the acrylic polymer is 100 parts by weight. Further, in synthesis of the acrylic polymer, the organic peroxide may be 0.35 parts by weight or more. In this case, it is also to decrease the organic peroxide to less than 0.35 parts by weight by purifying or heating the acrylic polymer as described above.

Preparation Example 6

As shown in Table 10, acrylic polymers of Preparation Example 6-1 to Preparation Example 6-18 were obtained using the acrylic monomer, the polymerization solvent and the polymerization initiator in each preparation example. Further, for the acrylic polymers obtained in Preparation Example 6-1 to Preparation Example 6-18, an extrapolated glass transition onset temperature was measured. The results are shown in Table 10. In the acrylic copolymer described below, the weight ratio of the repeating units derived from the monomers in the acrylic copolymer is equal to the weight ratio of the monomers at the time of production of the acrylic copolymer.

TABLE 10

| | Monomer | | | Polymerization | Amount used (parts by weight) Monomer | | | Polymerization | | Heat | Tg |
|---|---|---|---|---|---|---|---|---|---|---|---|
| | 1 | 2 | 3 | initiator | 1 | 2 | 3 | initiator | PGMAc | treatment | (° C.) |
| Preparation Example 6-1 | DCPMA | — | — | BPO | 20 | — | — | 0.22 | 80 | Yes | 175 |
| Preparation Example 6-2 | DCPMA | — | — | BPO | 20 | — | — | 0.11 | 80 | No | 175 |
| Preparation Example 6-3 | DCPMA | — | — | BPO | 20 | — | — | 0.15 | 80 | No | 175 |
| Preparation Example 6-4 | DCPMA | — | — | BPO | 20 | — | — | 0.22 | 80 | No | 175 |
| Preparation Example 6-5 | DCPMA | — | — | BPO | 20 | — | — | 0.44 | 80 | No | 175 |
| Preparation Example 6-6 | PhMA | — | — | BPO | 20 | — | — | 0.30 | 80 | Yes | 113 |
| Preparation Example 6-7 | PhMA | — | — | BPO | 20 | — | — | 0.15 | 80 | No | 113 |
| Preparation Example 6-8 | PhMA | — | — | BPO | 20 | — | — | 0.30 | 80 | No | 113 |
| Preparation Example 6-9 | PhMA | — | — | BPO | 20 | — | — | 0.45 | 80 | No | 113 |
| Preparation Example 6-10 | PhMA | — | — | BPO | 20 | — | — | 0.60 | 80 | No | 113 |
| Preparation Example 6-11 | MNA | — | — | BPO | 20 | — | — | 0.48 | 80 | Yes | 105 |
| Preparation Example 6-12 | MNA | — | — | BPO | 20 | — | — | 0.24 | 80 | No | 105 |
| Preparation Example 6-13 | MNA | — | — | BPO | 20 | — | — | 0.48 | 80 | No | 105 |
| Preparation Example 6-14 | MNA | — | — | BPO | 20 | — | — | 0.72 | 80 | No | 105 |
| Preparation Example 6-15 | MNA | — | — | AIBN | 20 | — | — | 0.33 | 70 | No | 105 |

TABLE 10-continued

| | Monomer | | | Polymerization | Amount used (parts by weight) Monomer | | | Polymerization | | Heat | Tg |
|---|---|---|---|---|---|---|---|---|---|---|---|
| | 1 | 2 | 3 | initiator | 1 | 2 | 3 | initiator | PGMAc | treatment | (° C.) |
| Preparation Example 6-16 | PhMA | HPMA | — | BPO | 14 | 6 | — | 0.29 | 80 | Yes | 118 |
| Preparation Example 6-17 | PhMA | HPMA | GMA | BPO | 14 | 3 | 3 | 0.30 | 80 | No | 101 |
| Preparation Example 6-18 | PhMA | HPMA | GMA | BPO | 14 | 4 | 2 | 0.30 | 80 | No | 107 |

Preparation Example 6-1

80 parts by weight of propylene glycol monomethyl ether acetate (PGMAc) was prepared as a polymerization solvent. 20 parts by weight of dicyclopentanyl methacrylate (DCPMA) ($C_{14}H_{20}O_2$) was prepared as an acrylic monomer. Further, 0.22 parts by weight of benzoyl peroxide (BPO) was prepared as a polymerization initiator. These were placed in a reaction vessel having a stirring device and a reflux tube, and then stirred and refluxed for 8 hours while being heated to 80° C. with nitrogen gas being introduced into the reaction vessel. Thus, a polymer solution containing a polymer formed from repeating units derived from dicyclopentanyl methacrylate was obtained.

Then, the obtained polymer solution was added to methanol. The precipitate produced was filtered off. The obtained residue was dried in vacuum to obtain an acrylic polymer powder. The acrylic polymer powder was heated in a vacuum dryer at 150° C. or more and 160° C. or less for 2 hours.

An extrapolated glass transition onset temperature of the dried acrylic polymer powder was measured by a method according to JIS K 7121-1987. The extrapolated glass transition onset temperature was found to be 175° C.

Preparation Example 6-2

A polymer solution containing a polymer formed from repeating units derived from dicyclopentanyl methacrylate was obtained in the same manner as in Preparation Example 6-1 except that the amount of the benzoyl peroxide was changed to 0.11 parts by weight and heating was not performed after polymerization in Preparation Example 6-1. The extrapolated glass transition onset temperature of the acrylic polymer was found to be 175° C.

Preparation Example 6-3

A polymer solution containing an acrylic polymer formed from repeating units derived from dicyclopentanyl methacrylate was obtained in the same manner as in Preparation Example 6-1 except that the amount of the benzoyl peroxide was changed to 0.15 parts by weight and heating was not performed after polymerization in Preparation Example 6-1. The extrapolated glass transition onset temperature of the acrylic polymer was found to be 175° C.

Preparation Example 6-4

A polymer solution containing a polymer containing repeating units derived from dicyclopentanyl methacrylate was obtained in the same manner as in Preparation Example 6-1 except that heating was not performed after polymerization in Preparation Example 6-1. The extrapolated glass transition onset temperature of the produced acrylic polymer was found to be 175° C.

Preparation Example 6-5

A polymer solution containing a polymer formed from repeating units derived from dicyclopentanyl methacrylate was obtained in the same manner as in Preparation Example 6-1 except that the amount of the benzoyl peroxide was changed to 0.44 parts by weight and heating was not performed after polymerization in Preparation Example 6-1. The extrapolated glass transition onset temperature of the produced acrylic polymer was found to be 175° C.

Preparation Example 6-6

A polymer formed from repeating units derived from phenyl methacrylate was obtained in the same manner as in Preparation Example 6-1 except that 20 parts by weight of phenyl methacrylate (PhMA)($C_{10}H_{10}O_2$) was prepared as an acrylic monomer and 0.30 parts by weight of BPO was prepared as a polymerization initiator in Preparation Example 6-1. The extrapolated glass transition onset temperature of the produced acrylic polymer was found to be 113° C.

Preparation Example 6-7

A polymer solution containing a polymer formed from repeating units derived from phenyl methacrylate was obtained in the same manner as in Preparation Example 6-6 except that the amount of the benzoyl peroxide was changed to 0.15 parts by weight and heating was not performed after polymerization in Preparation Example 6-6. The extrapolated glass transition onset temperature of the produced acrylic polymer was found to be 113° C.

Preparation Example 6-8

A polymer solution containing a polymer formed from repeating units derived from phenyl methacrylate was obtained in the same manner as in Preparation Example 6-6 except that the amount of the benzoyl peroxide was changed to 0.30 parts by weight and heating was not performed after polymerization in Preparation Example 6-6. The extrapolated glass transition onset temperature of the produced acrylic polymer was found to be 113° C.

Preparation Example 6-9

A polymer solution containing a polymer formed from repeating units derived from phenyl methacrylate was obtained in the same manner as in Preparation Example 6-6 except that the amount of the BPO was changed to 0.45 parts by weight and heating was not performed after polymerization in Preparation Example 6-6. The extrapolated glass transition onset temperature of the produced acrylic polymer was found to be 113° C.

Preparation Example 6-10

A polymer solution containing a polymer formed from repeating units derived from phenyl methacrylate was obtained in the same manner as in Preparation Example 6-6 except that the amount of the BPO was changed to 0.60 parts by weight and heating was not performed after polymerization in Preparation Example 6-6. The extrapolated glass transition onset temperature of the produced acrylic polymer was found to be 113° C.

Preparation Example 6-11

A polymer formed from repeating units derived from methyl methacrylate was obtained in the same manner as in Preparation Example 6-1 except that 20 parts by weight of methyl methacrylate (MMA) ($C_5H_8O_2$) was prepared as an acrylic monomer and 0.48 parts by weight of BPO was prepared as a polymerization initiator in Preparation Example 6-1. The extrapolated glass transition onset temperature of the produced acrylic polymer was found to be 105° C.

Preparation Example 6-12

A polymer solution containing a polymer formed from repeating units derived from methyl methacrylate was obtained in the same manner as in Preparation Example 6-11 except that the amount of the BPO was changed to 0.24 parts by weight and heating was not performed after polymerization in Preparation Example 6-11. The extrapolated glass transition onset temperature of the produced acrylic polymer was found to be 105° C.

Preparation Example 6-13

A polymer solution containing a polymer formed from repeating units derived from methyl methacrylate was obtained in the same manner as in Preparation Example 6-11 except that heating was not performed after polymerization in Preparation Example 6-11. The extrapolated glass transition onset temperature of the produced acrylic polymer was found to be 105° C.

Preparation Example 6-14

A polymer solution containing a polymer formed from repeating units derived from methyl methacrylate was obtained in the same manner as in Preparation Example 6-11 except that the amount of the BPO was changed to 0.72 parts by weight and heating was not performed after polymerization in Preparation Example 6-11. The extrapolated glass transition onset temperature of the produced acrylic polymer was found to be 105° C.

Preparation Example 6-15

A polymer solution containing a polymer formed from repeating units derived from methyl methacrylate was obtained in the same manner as in Preparation Example 6-14 except that the polymerization initiator was changed to 0.33 parts by weight of azobisisobutyronitrile (AIBN) and the temperature during stirring and reflux was changed to 70° C. in Preparation Example 6-14. The extrapolated glass transition onset temperature of the produced acrylic polymer was found to be 105° C.

Preparation Example 6-16

14 parts by weight of phenyl methacrylate and 6 parts by weight of 4-hydroxyphenyl methacrylate (HPMA) ($C_{10}H_{10}O_3$) were prepared as acrylic monomers, and 0.29 parts by weight of BPO was prepared as a polymerization initiator. A copolymer formed from repeating units derived from phenyl methacrylate and repeating units derived from 4-hydroxyphenyl methacrylate was obtained in the same manner as in preparation example 6-1. The extrapolated glass transition onset temperature of the produced acrylic polymer was found to be 118° C.

Preparation Example 6-17

14 parts by weight of phenyl methacrylate, 3 parts by weight of 4-hydroxyphenyl methacrylate, and 3 parts by weight of glycidyl methacrylate (GMA) ($C_7H_{10}O_3$) were prepared as acrylic monomers, and 0.30 parts by weight of BPO was prepared as a polymerization initiator. A polymer solution containing a copolymer formed from a fourth repeating unit derived from phenyl methacrylate, a fifth repeating unit derived from 4-hydroxyphenyl methacrylate and a sixth repeating unit derived from glycidyl methacrylate was obtained in the same manner as in Preparation Example 6-1 except that heating was not performed after polymerization. The extrapolated glass transition onset temperature of the produced acrylic polymer was found to be 101° C.

Preparation Example 6-18

14 parts by weight of phenyl methacrylate, 4 parts by weight of 4-hydroxyphenyl methacrylate and 2 parts by weight of glycidyl methacrylate were prepared as acrylic monomers, and 0.30 parts by weight of BPO was prepared as a polymerization initiator. A polymer solution containing a copolymer formed from a fourth repeating unit derived from phenyl methacrylate, a fifth repeating unit derived from 4-hydroxyphenyl methacrylate and a sixth repeating unit derived from glycidyl methacrylate was obtained in the same manner as in Preparation Example 6-1 except that heating was not performed after polymerization. The extrapolated glass transition onset temperature of the produced acrylic polymer was found to be 107° C.

Test Example 6

The infrared cut-off filters of Test Example 6-1 to Test Example 6-18 were obtained using acrylic polymers obtained in Preparation Example 6-1 to Preparation Example 6-18, respectively.

In Test Examples 6-1, 6-6, 6-11 and 6-16, propylene glycol monomethyl ether acetate was added to the heat-treated acrylic polymer powder to prepare an acrylic polymer solution with a solid concentration of 17%. On the other hand, in Test Examples 6-2 to 6-5, 6-7 to 6-10, 6-12 to 6-15, 6-17 and 6-18, propylene glycol monomethyl ether acetate was added to the polymer solution to prepare an acrylic polymer solution with a solid concentration of 17%.

Then, a coating liquid containing 0.3 g of cyanine dye, 12.0 g of an acrylic polymer solution and 10 g of PGMAc was prepared. The cyanine dye used was the dye represented by the above formula (5). The coating liquid was applied to the transparent substrate to form a coating film, and the coating film was dried. Then, the coating film was heated to 230° C. and cured to obtain an infrared cut-off filter having 1 μm thickness.

<Evaluation Method>

(Residual Amount of Organic Peroxide)

The infrared cut-off filter was analyzed using a nuclear magnetic resonance machine (400 MHz) (AVANCE NEO 400, manufactured by Bruker) to obtain a $^1$H NMR spectrum. Then, the residual amount (parts by weight) of the organic peroxide was calculated using the peak area of the organic peroxide contained in the $^1$H NMR spectrum by the following formula:

$$[(\text{peak area } A)\times(\text{molecular weight } A)/\{(\text{peak area } B)\times(\text{molecular weight } B)\}]\times 100.$$

When the acrylic polymer is composed of a single acrylic monomer, the residual amount of the organic peroxide can be calculated using the above formula. In the above formula, the peak area A is a peak area of the organic peroxide, and the molecular weight A is a molecular weight of the organic peroxide. The peak area B is a peak area of the acrylic polymer, and the molecular weight B is a molecular weight of a monomer constituting the acrylic polymer.

When the acrylic polymer is composed of a plurality of monomers, calculation was performed using mathematical formula (2) below. In mathematical formula (2), Mi is a molecular weight of a monomer i, and Si is a polymer peak area derived from the monomer i. The peak area A is a peak area of the organic peroxide, and the molecular weight A is a molecular weight of the organic peroxide.

Math. 1

$$[(\text{peak area } A)\times(\text{molecular weight } A)/\Sigma_i \text{SiMi}]\times 100 \quad \text{Mathematical formula (2)}$$

(Spectral Characteristics)

A transmittance of the infrared cut-off filter for light with a wavelength of 350 nm to 1200 nm was measured using a spectrophotometer (U-4100, manufactured by Hitachi High-Technologies Corporation). From the measurement result of the transmittance, an absorbance was calculated using the above mathematical formula (1). Thus, an absorbance spectrum of each infrared cut-off filter was obtained.

(Average Absorbance in Visible Light Region)

An average of the absorbance at wavelengths from 400 nm to 600 nm was calculated. An average absorbance smaller than or equal to 0.140 was rated as "good," and an average absorbance larger than 0.140 was rated as "poor."

(Absorbance at 950 nm)

The absorbance spectrum of the cyanine dye represented by the above formula (5) has a peak at 950 nm. Therefore, the absorbance at 950 nm in each infrared cut-off filter was evaluated. An absorbance at 950 nm larger than 0.80 was rated as "excellent," an absorbance at 950 nm in the range of 0.70 or more and 0.80 or less was rated as "good," and an absorbance at 950 nm less than 0.70 was rated as "poor." An infrared cut-off filter having an absorbance at 950 nm of 0.7 or more has an infrared light absorption ability suitable for use in a solid-state image sensor.

(Overall Evaluation)

The overall evaluation was performed based on the evaluation results of the average absorbance in the visible light region and of the absorbance at 950 nm. When the evaluation of the average absorbance was "excellent" and the evaluation of the absorbance at 950 nm was "excellent," the overall evaluation was rated as "excellent." When both the evaluation of the average absorbance and the evaluation of the absorbance at 950 nm were "good," the overall evaluation was rated as "good." On the other hand, when the evaluation of the average absorbance was "poor," the overall evaluation was rated as "poor."

<Evaluation Results>

Table 11 below shows the residual amount of the organic peroxide and the spectral characteristics of the infrared cut-off filters of Test Example 6-1 to Test Example 6-18.

TABLE 11

| | Residual amount (parts by weight) | Average absorbance | Evaluation | Absorbance (950 nm) | Evaluation | Overall evaluation |
|---|---|---|---|---|---|---|
| Test Example 6-1 | 0.000 | 0.119 | good | 0.74 | good | good |
| Test Example 6-2 | 0.003 | 0.130 | good | 0.75 | good | good |
| Test Example 6-3 | 0.030 | 0.123 | good | 0.74 | good | good |
| Test Example 6-4 | 0.200 | 0.133 | good | 0.74 | good | good |
| Test Example 6-5 | 0.400 | 0.145 | poor | 0.73 | good | poor |
| Test Example 6-6 | 0.000 | 0.140 | good | 0.86 | excellent | excellent |
| Test Example 6-7 | 0.003 | 0.138 | good | 0.86 | excellent | excellent |
| Test Example 6-8 | 0.030 | 0.132 | good | 0.85 | excellent | excellent |
| Test Example 6-9 | 0.200 | 0.134 | good | 0.84 | excellent | excellent |
| Test Example 6-10 | 0.400 | 0.148 | poor | 0.85 | excellent | poor |
| Test Example 6-11 | 0.000 | 0.130 | good | 0.78 | good | good |
| Test Example 6-12 | 0.020 | 0.136 | good | 0.76 | good | good |
| Test Example 6-13 | 0.150 | 0.138 | good | 0.70 | good | good |
| Test Example 6-14 | 0.350 | 0.180 | poor | 0.68 | poor | poor |
| Test Example 6-15 | 0.000 | 0.139 | good | 0.80 | good | good |
| Test Example 6-16 | 0.002 | 0.139 | good | 0.88 | excellent | excellent |
| Test Example 6-17 | 0.001 | 0.135 | good | 0.90 | excellent | excellent |
| Test Example 6-18 | 0.003 | 0.127 | good | 0.89 | excellent | excellent |

As shown in Table 11, in Test Example 6-1 to Test Example 6-4, Test Example 6-6 to Test Example 6-9, Test Example 6-11 to Test Example 6-13 and Test Example 6-15 to Test Example 6-18, the residual amount of the organic peroxide was found to be less than 0.35 parts by weight. On the other hand, in Test Example 6-5, Test Example 6-10 and Test Example 6-14, the residual amount of the organic peroxide was found to be 0.35 parts by weight or more.

Further, in Test Example 6-1 to Test Example 6-4, Test Example 6-6 to Test Example 6-9, Test Example 6-11 to Test Example 6-13 and Test Example 6-15 to Test Example 6-18, the average absorbance in the visible light region was found to be 0.140 or less. On the other hand, in Test Example 6-5, Test Example 6-10 and Test Example 6-14, the average absorbance in the visible light region was found to be more than 0.140.

As described above, it was found that, when the residual amount of the organic peroxide is less than 0.35 parts by weight, the average absorbance in the visible light region can be lowered to a degree that does not affect the detection sensitivity of the photoelectric conversion element associated with the color filter located under the infrared cut-off filter.

Further, while the absorbance at 950 nm in Test Example 6-14 was found to be less than 0.70, the absorbance at 950 nm in the other test examples was found to be 0.70 or more. More specifically, in Test Example 6-1 to Test Example 6-5, Test Example 6-11 to Test Example 6-13 and Test Example 6-15, the absorbance at 950 nm was found to be 0.70 or more and 0.80 or less. On the other hand, in Test Example 6-6 to Test Example 6-10 and Test Example 6-16 to Test Example 6-18, the absorbance at 950 nm was found to be more than 0.80.

In addition, from the comparison of the absorbance at 950 nm among Test Example 6-5, Test Example 6-10 and Test Example 6-14, it was found that the acrylic polymer preferably contains dicyclopentanyl methacrylate, and most preferably contains phenyl methacrylate in order to suppress the decrease in absorbance in the infrared light region even when the residual amount of the organic peroxide is large. On the other hand, in the test examples in which the acrylic polymer is formed only from methyl methacrylate, it was found that the absorbance in the visible light increases and the absorbance at 950 nm decreases when the residual amount of the organic peroxide exceeds 0.35 parts by weight.

As described above, according to the second embodiment of the infrared cut-off filter, the solid-state image sensor filter, the solid-state image sensor, and the method for producing a solid-state image sensor filter, the following advantageous effects can be obtained.

(2-1) Due to the content of the organic peroxide being less than 0.35 parts by weight, it is possible to prevent the spectral characteristics of the infrared cut-off filter 13 from deteriorating in both the visible light region and the infrared light region.

(2-2) Since the phenyl group contained in the fourth repeating unit is located between cyanine dyes adjacent to each other, a distance sufficient to prevent occurrence of aggregation between cyanine dyes can be formed between the cyanine dyes. This prevents deterioration of spectral characteristics at the expected absorption wavelengths of the cyanine dye.

(2-3) The phenolic hydroxyl group contained in the fifth repeating unit is crosslinked with the epoxy group of the sixth repeating unit to form a crosslinked structure. This prevents the absorbance of the infrared cut-off filter 13 from decreasing due to heating.

(2-4) Since the barrier layer 14 prevents oxidation sources from reaching the infrared cut-off filter 13, the infrared cut-off filter 13 is not likely to be oxidized by an oxidation source.

Modifications of Second Embodiment

The above embodiment can be modified and implemented as below.

(Acrylic Polymer)

The acrylic polymer may contain a repeating unit other than the fourth repeating unit, the fifth repeating unit and the sixth repeating unit. In this case as well, the effect similar to the above (2-1) can be obtained as long as the organic peroxide contained in the infrared cut-off filter 13 is less than 0.35 parts by weight relative to 100 parts by weight of the acrylic polymer.

The acrylic polymer may not necessarily contain at least one of the first repeating unit, the second repeating unit and the third repeating unit. In this case as well, the effect similar to the above (2-1) can be obtained as long as the organic peroxide contained in the infrared cut-off filter 13 is less than 0.35 parts by weight relative to 100 parts by weight of the acrylic polymer.

(Others)

In the infrared cut-off filter 13 of the first embodiment, less than 0.35 parts by weight of the organic peroxide may be contained relative to 100 parts by weight of the copolymer. In this case, the effect similar to the above (2-1) can be obtained in the infrared cut-off filter 13 of the first embodiment.

The second embodiment is a modification of the first embodiment, and can be implemented in combination with modifications of the barrier layer 14, the color filter, the infrared cut-off filter 13, and the like.

Third Embodiment

A third embodiment of an infrared cut-off filter, a solid-state image sensor filter, a solid-state image sensor, and a method for producing a solid-state image sensor filter will be described. The infrared cut-off filter of the third embodiment differs from the infrared cut-off filter of the first embodiment in the acrylic polymer contained in the infrared cut-off filter. Therefore, in the following description, the difference between the third embodiment and the first embodiment will be described in detail, while description common to the third embodiment and the first embodiment is omitted.

<Infrared Cut-Off Filter>

The infrared cut-off filter 13 contains a cyanine dye and an acrylic polymer. The cyanine dye is a cyanine dye that can be used in the first embodiment.

The acrylic copolymer contains a seventh repeating unit and an eighth repeating unit different from the seventh repeating unit. The seventh repeating unit is derived from 4-hydroxyphenyl methacrylate (HPMA) ($C_{10}H_{10}O_3$) represented by formula (49) below.

Chem. 51

Formula (49)

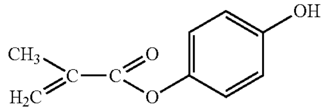

Due to the acrylic copolymer containing the seventh repeating unit derived from 4-hydroxyphenyl methacrylate, a decrease in absorbance of the infrared cut-off filter due to heating can be suppressed compared with the case where the acrylic copolymer is formed only from an eighth repeating unit.

According to the acrylic copolymer containing HPMA, both the rate of weight loss due to heating in an oxygen-free atmosphere and the rate of weight loss due to heating in an atmosphere containing oxygen can be suppressed within a predetermined range compared with an acrylic copolymer containing no HPMA or an acrylic homopolymer. In the acrylic polymer, the heating of the acrylic polymer causes decomposition of the acrylic polymer, such as depolymerization and dissociation of side chains. Decomposition of the acrylic polymer may occur in various manners depending on the presence or absence of oxygen in the atmosphere in which the acrylic polymer is heated. In an environment in which the infrared cut-off filter containing the acrylic polymer is heated, both the reaction of decomposing the acrylic polymer in an atmosphere containing oxygen and the reaction of decomposing the acrylic polymer in an oxygen-free atmosphere proceed.

As the acrylic polymer is decomposed, radicals are generated in the infrared cut-off filter. The radicals in the infrared cut-off filter react with the cyanine dye in the infrared cut-off filter, in particular, with the polymethine chain in the cyanine dye, and change the spectral characteristics of the cyanine dye from those before the reaction. As a result, the infrared cut-off filter undergoes a decrease in absorbance, in other words, an increase in transmittance at the wavelength required for the infrared cut-off filter, resulting in deterioration of the spectral characteristics of the infrared cut-off filter.

In this regard, according to the acrylic copolymer containing HPMA, in which both the rate of weight loss due to heating in an oxygen-free atmosphere and the rate of weight loss due to heating in an atmosphere containing oxygen can be suppressed within a predetermined range as described above, it is possible to prevent deterioration of the spectral characteristics of the infrared cut-off filter due to heating.

The eighth repeating unit may be derived from phenyl methacrylate (PhMA) ($C_{10}H_{10}O_2$) represented by formula (48) below. In this case, it is preferred that the acrylic copolymer is composed of the seventh repeating unit and the eighth repeating unit and contains 5 mass % or more of the seventh repeating unit.

Chem. 52

Formula (48)

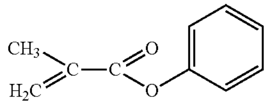

A decrease in absorbance of the infrared cut-off filter due to heating can be suppressed compared with the case where the acrylic copolymer is composed of two components, the seventh repeating unit and the eighth repeating unit, and contains less than 5 mass % of the seventh repeating unit.

When the acrylic copolymer is composed of the seventh repeating unit and the eighth repeating unit, the acrylic copolymer preferably contains 10 mass % or more and 20 mass % or less of the seventh repeating unit. Due to the acrylic copolymer composed of the two components containing 10 mass % or more and 20 mass % or less of the seventh repeating unit, a decrease in absorbance of the infrared cut-off filter due to heating can be particularly suppressed.

Further, the eighth repeating unit may be derived from phenyl methacrylate, and the acrylic copolymer may be composed of the seventh repeating unit, the eighth repeating unit and the ninth repeating unit. In this case, the ninth repeating unit is preferably derived from glycidyl methacrylate (GMA) ($C_7H_{10}O_3$) represented by formula (50) below, and the acrylic copolymer preferably contains 15 mass % or less of the third repeating unit.

Chem. 53

Formula (50)

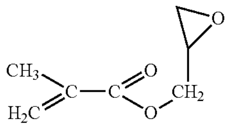

Further, the acrylic copolymer preferably contains 10 mass % or more and 25 mass % or less of the seventh repeating unit. In this case, the absorbance of the infrared cut-off filter containing the acrylic copolymer composed of three components can be prevented from decreasing due to heating.

Further, the eighth repeating unit may be derived from methyl methacrylate (MMA) ($C_5H_8O_2$) represented by formula (51) below, and the acrylic copolymer may be composed of the seventh repeating unit, the eighth repeating unit and the ninth repeating unit. In this case, the ninth repeating unit is derived from dicyclopentanyl methacrylate (DCPMA) ($C_{14}H_{20}O_2$) represented by formula (52) below.

Chem. 54

Formula (51)

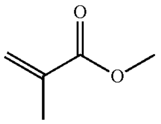

Chem. 55

Formula (52)

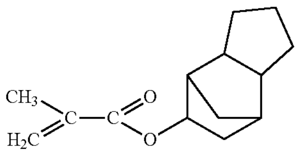

Thus, the absorbance of the infrared cut-off filter composed of three components containing methyl methacrylate and dicyclopentanyl methacrylate can be prevented from decreasing due to heating.

Preparation Examples

Referring to Table 12, preparation examples will be described. The ratio of the repeating units contained in the acrylic copolymers prepared in the preparation examples is equal to the ratio of the usage amount of the acrylic monomers used to produce the acrylic copolymers.

TABLE 12

| | Monomer | | | Amount used (parts by weight) | | | | |
|---|---|---|---|---|---|---|---|---|
| | 1 | 2 | 3 | 1 | 2 | 3 | BPO | PGMEA |
| Preparation Example 7-1 | MMA | — | — | 100 | — | — | 2.42 | 400 |
| Preparation Example 7-2 | DCPMA | — | — | 100 | — | — | 1.10 | 400 |
| Preparation Example 7-3 | CHMA | — | — | 100 | — | — | 1.44 | 400 |
| Preparation Example 7-4 | PhMA | — | — | 100 | — | — | 1.49 | 400 |
| Preparation Example 7-5 | DCPMA | MMA | — | 50 | 50 | — | 1.76 | 400 |
| Preparation Example 7-6 | CHMA | MMA | — | 50 | 50 | — | 1.93 | 400 |
| Preparation Example 7-7 | PhMA | MMA | — | 50 | 50 | — | 1.96 | 400 |
| Preparation Example 7-8 | PhMA | DCPMA | — | 50 | 50 | — | 1.30 | 400 |
| Preparation Example 7-9 | DCPMA | MMA | HPMA | 50 | 35 | 15 | 1.60 | 400 |
| Preparation Example 7-10 | PhMA | HPMA | GMA | 80 | 10 | 10 | 1.50 | 400 |
| Preparation Example 7-11 | PhMA | HPMA | GMA | 70 | 25 | 5 | 1.47 | 400 |
| Preparation Example 7-12 | PhMA | HPMA | GMA | 70 | 15 | 15 | 1.50 | 400 |
| Preparation Example 7-13 | PhMA | HPMA | GMA | 70 | 18 | 12 | 1.49 | 400 |
| Preparation Example 7-14 | PhMA | HPMA | GMA | 70 | 20 | 10 | 1.49 | 400 |
| Preparation Example 7-15 | PhMA | HPMA | GMA | 70 | 22.5 | 7.5 | 1.48 | 400 |
| Preparation Example 7-16 | PhMA | HPMA | GMA | 70 | 24 | 6 | 1.47 | 400 |
| Preparation Example 7-17 | PhMA | HPMA | GMA | 65 | 21 | 14 | 1.49 | 400 |
| Preparation Example 7-18 | PhMA | HPMA | GMA | 65 | 25 | 10 | 1.48 | 400 |
| Preparation Example 7-19 | PhMA | HPMA | GMA | 65 | 17.5 | 17.5 | 1.51 | 400 |
| Preparation Example 7-20 | PhMA | HPMA | — | 98 | 2 | — | 1.49 | 400 |
| Preparation Example 7-21 | PhMA | HPMA | — | 95 | 5 | — | 1.49 | 400 |
| Preparation Example 7-22 | PhMA | HPMA | — | 90 | 10 | — | 1.48 | 400 |
| Preparation Example 7-23 | PhMA | HPMA | — | 80 | 20 | — | 1.47 | 400 |
| Preparation Example 7-24 | PhMA | HPMA | — | 70 | 30 | — | 1.45 | 400 |
| Preparation Example 7-25 | PhMA | HPMA | — | 60 | 40 | — | 1.44 | 400 |

Preparation Example 7-1

400 parts by weight of propylene glycol monomethyl ether acetate (PGMEA) was prepared as a polymerization solvent, and 100 parts by weight of methyl methacrylate (MMA) ($C_5H_8O_2$) was prepared as an acrylic monomer. Further, 2.42 parts by weight of benzoyl peroxide (BPO) was prepared as a radical polymer. These were placed in a reaction vessel having a stirring device and a reflux tube, and then stirred and refluxed for 8 hours while being heated to 80° C. with nitrogen gas being introduced into the reaction vessel. Thus, a polymer solution containing a homopolymer formed from methyl methacrylate was obtained.

Preparation Example 7-2

A polymer solution containing a homopolymer formed from dicyclopentanyl methacrylate was obtained in the same manner as in Preparation Example 7-1 except that methyl methacrylate was changed to dicyclopentanyl methacrylate (DCPMA) ($C_{14}H_{20}O_2$) and the amount of benzoyl peroxide was changed to 1.10 parts by weight in Preparation Example 7-1.

Preparation Example 7-3

A polymer solution containing a homopolymer formed from cyclohexyl methacrylate was obtained in the same manner as in Preparation Example 7-1 except that methyl methacrylate was changed to cyclohexyl methacrylate (CHMA) ($C_{10}H_{16}O_2$) and the amount of benzoyl peroxide was changed to 1.44 parts by weight in Preparation Example 7-1.

Preparation Example 7-4

A polymer solution containing a homopolymer formed from phenyl methacrylate was obtained in the same manner as in Preparation Example 7-1 except that methyl methacrylate was changed to phenyl methacrylate (PhMA) ($C_{10}H_{10}O_2$) and the amount of benzoyl peroxide was changed to 1.49 parts by weight in Preparation Example 7-1.

Preparation Example 7-5

50 parts by weight of dicyclopentanyl methacrylate and 50 parts by weight of methyl methacrylate were prepared as acrylic monomers, and the amount of benzoyl peroxide was changed to 1.76 parts by weight in Preparation Example 7-1. A polymer solution containing a copolymer formed from dicyclopentanyl methacrylate and methyl methacrylate was obtained in the same manner as in Preparation Example 7-1.

Preparation Example 7-6

A polymer solution containing a copolymer formed from cyclohexyl methacrylate and methyl methacrylate was obtained in the same manner as in Preparation Example 7-5 except that dicyclopentanyl methacrylate was changed to cyclohexyl methacrylate and the amount of benzoyl peroxide was changed to 1.93 parts by weight in Preparation Example 7-5.

Preparation Example 7-7

A polymer solution containing a copolymer formed from phenyl methacrylate and methyl methacrylate was obtained in the same manner as in Preparation Example 7-5 except that dicyclopentanyl methacrylate was changed to phenyl methacrylate and the amount of benzoyl peroxide was changed to 1.96 parts by weight in Preparation Example 7-5.

Preparation Example 7-8

A polymer solution containing a copolymer formed from phenyl methacrylate and dicyclopentanyl methacrylate was obtained in the same manner as in Preparation Example 7-7 except that methyl methacrylate was changed to dicyclopentanyl methacrylate and the amount of benzoyl peroxide was changed to 1.30 parts by weight in Preparation Example 7-7.

Preparation Example 7-9

50 parts by weight of dicyclopentanyl methacrylate, 35 parts by weight of methyl methacrylate and 15 parts by weight of 4-hydroxyphenyl methacrylate were prepared as acrylic monomers, and the amount of benzoyl peroxide was changed to 1.60 parts by weight in Preparation Example 7-1. A polymer solution containing a copolymer formed from dicyclopentanyl methacrylate, methyl methacrylate and 4-hydroxyphenyl methacrylate was obtained in the same manner as in Preparation Example 7-1.

Preparation Example 7-10

80 parts by weight of phenyl methacrylate, 10 parts by weight of 4-hydroxyphenyl methacrylate and 10 parts by weight of glycidyl methacrylate (GMA) ($C_7H_{10}O_3$) were prepared as acrylic monomers, and the amount of benzoyl peroxide was changed to 1.50 parts by weight in Preparation Example 7-1. A polymer solution containing a copolymer formed from phenyl methacrylate, 4-hydroxyphenyl methacrylate and glycidyl methacrylate was obtained in the same manner as in Preparation Example 7-1.

Preparation Example 7-11

The amount of phenyl methacrylate was changed to 70 parts by weight, the amount of 4-hydroxyphenyl methacrylate was changed to 25 parts by weight, the amount of glycidyl methacrylate was changed to 5 parts by weight, and the amount of benzoyl peroxide was changed to 1.47 parts by weight in Preparation Example 7-10. A polymer solution containing a copolymer formed from phenyl methacrylate, 4-hydroxyphenyl methacrylate and glycidyl methacrylate was obtained in the same manner as in Preparation Example 7-10.

Preparation Example 7-12

The amount of 4-hydroxyphenyl methacrylate was changed to 15 parts by weight, the amount of glycidyl methacrylate was changed to 15 parts by weight, and the amount of benzoyl peroxide was changed to 1.50 parts by weight in Preparation Example 7-11. A polymer solution containing a copolymer formed from phenyl methacrylate, 4-hydroxyphenyl methacrylate and glycidyl methacrylate was obtained in the same manner as in Preparation Example 7-11.

Preparation Example 7-13

The amount of 4-hydroxyphenyl methacrylate was changed to 18 parts by weight, the amount of glycidyl methacrylate was changed to 12 parts by weight, and the amount of benzoyl peroxide was changed to 1.49 parts by weight in Preparation Example 7-11. A polymer solution containing a copolymer formed from phenyl methacrylate, 4-hydroxyphenyl methacrylate and glycidyl methacrylate was obtained in the same manner as in Preparation Example 7-11.

Preparation Example 7-14

The amount of 4-hydroxyphenyl methacrylate was changed to 20 parts by weight, and the amount of glycidyl methacrylate was changed to 10 parts by weight in Preparation Example 7-13. A polymer solution containing a copolymer formed from phenyl methacrylate, 4-hydroxyphenyl methacrylate and glycidyl methacrylate was obtained in the same manner as in Preparation Example 7-13.

Preparation Example 7-15

The amount of 4-hydroxyphenyl methacrylate was changed to 22.5 parts by weight, the amount of glycidyl methacrylate was changed to 7.5 parts by weight, and the amount of benzoyl peroxide was changed to 1.48 parts by weight in Preparation Example 7-11. A polymer solution containing a copolymer formed from phenyl methacrylate, 4-hydroxyphenyl methacrylate and glycidyl methacrylate was obtained in the same manner as in Preparation Example 7-11.

Preparation Example 7-16

The amount of 4-hydroxyphenyl methacrylate was changed to 24 parts by weight, the amount of glycidyl methacrylate was changed to 6 parts by weight, and the amount of benzoyl peroxide was changed to 1.47 parts by weight in Preparation Example 7-11. A polymer solution containing a copolymer formed from phenyl methacrylate, 4-hydroxyphenyl methacrylate and glycidyl methacrylate was obtained in the same manner as in Preparation Example 7-11.

Preparation Example 7-17

The amount of phenyl methacrylate was changed to 65 parts by weight, the amount of 4-hydroxyphenyl methacrylate was changed to 21 parts by weight, and the amount of glycidyl methacrylate was changed to 14 parts by weight in Preparation Example 7-13. A polymer solution containing a copolymer formed from phenyl methacrylate, 4-hydroxyphenyl methacrylate and glycidyl methacrylate was obtained in the same manner as in Preparation Example 7-13.

Preparation Example 7-18

The amount of 4-hydroxyphenyl methacrylate was changed to 25 parts by weight, the amount of glycidyl methacrylate was changed to 10 parts by weight, and the amount of benzoyl peroxide was changed to 1.48 parts by weight in Preparation Example 7-17. A polymer solution containing a copolymer formed from phenyl methacrylate, 4-hydroxyphenyl methacrylate and glycidyl methacrylate was obtained in the same manner as in Preparation Example 7-17.

Preparation Example 7-19

The amount of 4-hydroxyphenyl methacrylate was changed to 17.5 parts by weight, the amount of glycidyl methacrylate was changed to 17.5 parts by weight, and the amount of benzoyl peroxide was changed to 1.51 parts by weight in Preparation Example 7-17. A polymer solution containing a copolymer formed from phenyl methacrylate, 4-hydroxyphenyl methacrylate and glycidyl methacrylate was obtained in the same manner as in Preparation Example 7-17.

Preparation Example 7-20

A polymer solution containing a copolymer formed from phenyl methacrylate and 4-hydroxyphenyl methacrylate was obtained in the same manner as in Preparation Example 7-4 except that 98 parts by weight of phenyl methacrylate and 2 parts by weight of 4-hydroxyphenyl methacrylate were prepared in Preparation Example 7-4.

Preparation Example 7-21

A polymer solution containing a copolymer formed from phenyl methacrylate and 4-hydroxyphenyl methacrylate was obtained in the same manner as in Preparation Example 7-20 except that the amount of phenyl methacrylate was changed to 95 parts by weight and the amount of 4-hydroxyphenyl methacrylate was changed to 5 parts by weight in Preparation Example 7-20.

Preparation Example 7-22

The amount of phenyl methacrylate was changed to 90 parts by weight, the amount of 4-hydroxyphenyl methacrylate was changed to 10 parts by weight, and the amount of benzoyl peroxide was changed to 1.48 parts by weight in Preparation Example 7-20. A polymer solution containing a copolymer formed from phenyl methacrylate and 4-hydroxyphenyl methacrylate was obtained in the same manner as in Preparation Example 7-20.

Preparation Example 7-23

The amount of phenyl methacrylate was changed to 80 parts by weight, the amount of 4-hydroxyphenyl methacrylate was changed to 20 parts by weight, and the amount of benzoyl peroxide was changed to 1.47 parts by weight in Preparation Example 7-20. A polymer solution containing a copolymer formed from phenyl methacrylate and 4-hydroxyphenyl methacrylate was obtained in the same manner as in Preparation Example 7-20.

Preparation Example 7-24

The amount of phenyl methacrylate was changed to 70 parts by weight, the amount of 4-hydroxyphenyl methacrylate was changed to 30 parts by weight, and the amount of benzoyl peroxide was changed to 1.45 parts by weight in Preparation Example 7-20. A polymer solution containing a copolymer formed from phenyl methacrylate and 4-hydroxyphenyl methacrylate was obtained in the same manner as in Preparation Example 7-20.

Preparation Example 7-25

The amount of phenyl methacrylate was changed to 60 parts by weight, the amount of 4-hydroxyphenyl methacrylate was changed to 40 parts by weight, and the amount of benzoyl peroxide was changed to 1.44 parts by weight in Preparation Example 7-20. A polymer solution containing a copolymer formed from phenyl methacrylate and 4-hydroxyphenyl methacrylate was obtained in the same manner as in Preparation Example 7-20.

<Evaluation Method>

(Weight Loss Rate)

For the acrylic polymers of the preparation examples, the weight loss rate (%) in a nitrogen atmosphere and the weight loss rate (%) in an air atmosphere were measured by the following method. The weight loss rate (%) was measured using a simultaneous differential thermal and thermogravimetric analyzer (STA7000, manufactured by Hitachi High-Tech Science Corporation). The polymer solution obtained in each preparation example was prepared and powdered, and the powdered sample was heated at 250° C. for 20 minutes in each of a nitrogen atmosphere and an air atmosphere. Then, a weight loss amount (W) was obtained by subtracting the weight of each sample after heating from an initial weight before heating ($W_0$), and the weight loss amount (W) obtained was divided by the initial weight ($W_0$) to calculate a weight loss rate ($W/W_0$).

<Evaluation Results>

Table 13 below shows the measurement results of the weight loss rates of the acrylic polymers of the preparation examples.

TABLE 13

| | Monomer | | | Amount used (parts by weight) | | | Weight loss rate (%) | |
|---|---|---|---|---|---|---|---|---|
| | | | | | | | Nitrogen | Air |
| | 1 | 2 | 3 | 1 | 2 | 3 | atmosphere | atmosphere |
| Preparation Example 7-1 | MMA | — | — | 100 | — | — | −7.18 | −28.22 |
| Preparation Example 7-2 | DCPMA | — | — | 100 | — | — | −9.19 | −23.67 |
| Preparation Example 7-3 | CHMA | — | — | 100 | — | — | −5.63 | −35.17 |
| Preparation Example 7-4 | PhMA | — | — | 100 | — | — | −32.90 | −6.39 |
| Preparation Example 7-5 | DCPMA | MMA | — | 50 | 50 | — | −18.09 | −64.92 |
| Preparation Example 7-6 | CHMA | MMA | — | 50 | 50 | — | −17.12 | −73.38 |
| Preparation Example 7-7 | PhMA | MMA | — | 50 | 50 | — | −20.72 | −2.28 |
| Preparation Example 7-8 | PhMA | DCPMA | — | 50 | 50 | — | −29.16 | −48.86 |
| Preparation Example 7-9 | DCPMA | MMA | HPMA | 50 | 35 | 15 | −14.25 | −4.88 |
| Preparation Example 7-10 | PhMA | HPMA | GMA | 80 | 10 | 10 | −17.61 | −6.90 |
| Preparation Example 7-11 | PhMA | HPMA | GMA | 70 | 25 | 5 | −17.30 | −5.10 |
| Preparation Example 7-12 | PhMA | HPMA | GMA | 70 | 15 | 15 | −18.90 | −7.10 |
| Preparation Example 7-13 | PhMA | HPMA | GMA | 70 | 18 | 12 | −15.00 | −7.50 |
| Preparation Example 7-14 | PhMA | HPMA | GMA | 70 | 20 | 10 | −14.80 | −8.20 |
| Preparation Example 7-15 | PhMA | HPMA | GMA | 70 | 22.5 | 7.5 | −14.10 | −9.00 |
| Preparation Example 7-16 | PhMA | HPMA | GMA | 70 | 24 | 6 | −13.80 | −9.30 |
| Preparation Example 7-17 | PhMA | HPMA | GMA | 65 | 21 | 14 | −12.60 | −11.50 |
| Preparation Example 7-18 | PhMA | HPMA | GMA | 65 | 25 | 10 | −11.30 | −13.70 |
| Preparation Example 7-19 | PhMA | HPMA | GMA | 65 | 17.5 | 17.5 | −25.34 | −8.60 |
| Preparation Example 7-20 | PhMA | HPMA | — | 98 | 2 | — | −26.3 | −3.13 |
| Preparation Example 7-21 | PhMA | HPMA | — | 95 | 5 | — | −19.4 | −5.21 |
| Preparation Example 7-22 | PhMA | HPMA | — | 90 | 10 | — | −18.7 | −6.32 |
| Preparation Example 7-23 | PhMA | HPMA | — | 80 | 20 | — | −15.5 | −7.61 |
| Preparation Example 7-24 | PhMA | HPMA | — | 70 | 30 | — | −13.9 | −9.66 |
| Preparation Example 7-25 | PhMA | HPMA | — | 60 | 40 | — | −11.5 | −10.8 |

As shown in Table 13, from the measurement results of Preparation Example 7-1 to Preparation Example 7-4, either the weight loss rate in a nitrogen atmosphere or the weight loss rate in an air atmosphere was found to be extremely large in the acrylic homopolymer containing no repeating unit derived from 4-hydroxyphenyl methacrylate. Further, from the measurement results of Preparation Examples 7-5, 7-6 and 7-8, either the weight loss rate in a nitrogen atmosphere or the weight loss rate in an air atmosphere was found to be extremely large in the acrylic copolymer containing no repeating unit derived from 4-hydroxyphenyl methacrylate as in the acrylic homopolymer. In addition, from the measurement results of Preparation Examples 7-5, 7-6 and 7-8, both the weight loss rate in a nitrogen atmosphere and the weight loss rate in an air atmosphere were found to tend to be large in the acrylic copolymer containing no repeating unit derived from 4-hydroxyphenyl methacrylate, compared with those in the acrylic homopolymer.

On the other hand, from the measurement results of Preparation Example 7-20 to Preparation Example 7-25, the acrylic copolymer composed of two components, the repeating unit derived from phenyl methacrylate and the repeating unit derived from 4-hydroxyphenyl methacrylate, was found to have the tendency described below, compared with the acrylic homopolymer and the acrylic copolymer containing no repeating unit derived from 4-hydroxyphenyl methacrylate. That is, both the weight loss rate in a nitrogen atmosphere and the weight loss rate in an air atmosphere were found to be suppressed to be within a predetermined range. Further, from the measurement results of Preparation Example 7-20 to Preparation Example 7-25, both the weight loss rate in a nitrogen atmosphere and the weight loss rate in an air atmosphere were found to be suppressed to be 20% or less when the acrylic copolymer contains 5 parts by weight or more of the repeating unit derived from 4-hydroxyphenyl methacrylate.

In addition, from the measurement results of Preparation Example 7-20 to Preparation Example 7-25, the weight loss rate in a nitrogen atmosphere was found to decrease with an increase in the content of the repeating units derived from 4-hydroxyphenyl methacrylate in the acrylic copolymer composed of two components, the repeating unit derived from phenyl methacrylate and the repeating unit derived from 4-hydroxyphenyl methacrylate. On the other hand, the weight loss rate in an air atmosphere was found to decrease with a decrease in the content of the repeating units derived from 4-hydroxyphenyl methacrylate in the acrylic copolymer composed of two components, the repeating unit derived from phenyl methacrylate and the repeating unit derived from 4-hydroxyphenyl methacrylate.

From the measurement results of Preparation Example 7-9 to Preparation Example 7-19, the acrylic copolymer composed of three components including the repeating unit derived from 4-hydroxyphenyl methacrylate was found to have the tendency described below, compared with the acrylic homopolymer or the acrylic polymer containing no repeating unit derived from 4-hydroxyphenyl methacrylate. That is, both the weight loss rate in a nitrogen atmosphere and the weight loss rate in an air atmosphere were found to be suppressed to be within a predetermined range.

Further, from the measurement results of Preparation Example 7-10 to Preparation Example 7-19, the acrylic copolymer composed of three components of the repeating unit derived from phenyl methacrylate, the repeating unit derived from 4-hydroxyphenyl methacrylate and the repeating unit derived from glycidyl methacrylate was found to have the tendency described below. That is, when the content of the repeating units derived from glycidyl methacrylate was 15 parts by weight or less, the weight loss rate in a nitrogen atmosphere was found to be further reduced compared with the case where the content of the repeating unit derived from glycidyl methacrylate was larger than 15 parts by weight.

Further, from the measurement results of Preparation Example 7-10 to Preparation Example 7-19, the weight loss rate in a nitrogen atmosphere was found to decrease with an increase in the content of the repeating units derived from 4-hydroxyphenyl methacrylate on the premise that the content of the repeating units derived from phenyl methacrylate contained in the acrylic copolymer is the same. Further, the weight loss rate in an air atmosphere was found to decrease with a decrease in the content of the repeating units derived from 4-hydroxyphenyl methacrylate for the same content of repeating units derived from phenyl methacrylate contained in the acrylic copolymer.

Test Example 7

Referring to Table 14, test examples will be described.

25 types of infrared cut-off filters were obtained using the acrylic copolymers of Preparation Example 7-1 to Preparation Example 7-25 by the method described below. The transmittance of each infrared cut-off filter before and after the heat resistance test was measured by the method described below.

A coating liquid containing 0.3 g of cyanine dye, 12.0 g of a 25% polymer solution, and 10 g of propylene glycol monomethyl ether acetate was prepared. The dye used was the cyanine dye represented by the above formula (5), and 25 types of polymer solutions including the acrylic copolymers obtained in the above Preparation Example 7-1 to Preparation Example 7-25, respectively, were used. The coating liquid was applied to the transparent substrate, and the coating film was dried. Then, the coating film was heated to 230° C. and cured to obtain infrared cut-off filters of Test Example 7-1 to Test Example 7-25 having a thickness of 1.0 μm.

<Evaluation Method>

(Spectral Characteristics)

A transmittance of the infrared cut-off filter of each test example for light with a wavelength of 350 nm to 1150 nm was measured using a spectrophotometer (U-4100, manufactured by Hitachi High-Technologies Corporation). Thus, a transmittance spectrum of each infrared cut-off filter was obtained. The transmittance spectrum of the cyanine dye represented by the above formula (5) has a minimum value at 950 nm. Therefore, the transmittance at 950 nm of each infrared cut-off filter before and after the heat resistance test was measured.

(Heat Resistance Test)

After the transmittance of the infrared cut-off filter of each test example was measured, the infrared cut-off filter of each test example was heated to 250° C. The transmittance of the infrared cut-off filter of each test example after heating was measured in the same manner as that performed for the infrared cut-off filter of each test example before heating.

(Amount of Change in Transmittance)

For each test example, the amount of change in transmittance was calculated by subtracting the transmittance at 950 nm before the heat resistance test from the transmittance at 950 nm after the heat resistance test.

<Evaluation Results>

Table 14 shows the transmittance before the heat resistance test, that is, the initial transmittance, and the amount of change in transmittance in each test example. An infrared cut-off filter before the heat resistance test with a transmittance at 950 nm of less than 20% was rated as "good," and a transmittance at 950 nm of 20% or more was rated as "poor." Further, an infrared cut-off filter after the heat resistance test with an amount of change in transmittance of 15% or less was rated as "good," an amount of change in transmittance of larger than 15% and 20% or less was rated as "fair," and an amount of change in transmittance of larger than 20% was rated as "poor."

TABLE 14

| | Weight loss Rate (%) | | | | Amount of | |
|---|---|---|---|---|---|---|
| | Nitrogen atmosphere | Air atmosphere | Initial transmittance | Evaluation | change in transmittance | Evaluation |
| Test Example 7-1 | −7.18 | −28.22 | 22.3 | poor | 25.5 | poor |
| Test Example 7-2 | −9.19 | −23.67 | 19.8 | good | 47.9 | poor |
| Test Example 7-3 | −5.63 | −35.17 | 19.0 | good | 26.4 | poor |
| Test Example 7-4 | −32.90 | −6.39 | 13.2 | good | 34.2 | poor |
| Test Example 7-5 | −18.09 | −64.92 | 14.9 | good | 32.2 | poor |

TABLE 14-continued

| | Weight loss Rate (%) Nitrogen atmosphere | Air atmosphere | Initial transmittance | Evaluation | Amount of change in transmittance | Evaluation |
|---|---|---|---|---|---|---|
| Test Example 7-6 | −17.12 | −73.38 | 14.4 | good | 26.2 | poor |
| Test Example 7-7 | −20.72 | −2.28 | 14.2 | good | 35.6 | poor |
| Test Example 7-8 | −29.16 | −48.86 | 14.9 | good | 36.4 | poor |
| Test Example 7-9 | −14.25 | −4.88 | 13.7 | good | 13.5 | good |
| Test Example 7-10 | −17.61 | −6.90 | 8.5 | good | 10.6 | good |
| Test Example 7-11 | −17.30 | −5.10 | 9.9 | good | 13.9 | good |
| Test Example 7-12 | −18.90 | −7.10 | 12.0 | good | 12.7 | good |
| Test Example 7-13 | −15.00 | −7.50 | 10.1 | good | 14.5 | good |
| Test Example 7-14 | −14.80 | −8.20 | 11.2 | good | 8.2 | good |
| Test Example 7-15 | −14.10 | −9.00 | 12.3 | good | 10.0 | good |
| Test Example 7-16 | −13.80 | −9.30 | 12.5 | good | 10.0 | good |
| Test Example 7-17 | −12.60 | −11.50 | 13.5 | good | 15.0 | good |
| Test Example 7-18 | −11.30 | −13.70 | 14.7 | good | 14.4 | good |
| Test Example 7-19 | −25.34 | −8.60 | 13.8 | good | 18.8 | fair |
| Test Example 7-20 | −26.3 | −3.13 | 10.3 | good | 17.6 | fair |
| Test Example 7-21 | −19.4 | −5.21 | 9.6 | good | 13.6 | good |
| Test Example 7-22 | −18.7 | −6.32 | 10.7 | good | 10.1 | good |
| Test Example 7-23 | −15.5 | −7.61 | 11.6 | good | 11.3 | good |
| Test Example 7-24 | −13.9 | −9.66 | 12.0 | good | 12.2 | good |
| Test Example 7-25 | −11.5 | −10.8 | 13.5 | good | 12.6 | good |

As shown in Table 14, the amount of change in transmittance in the infrared cut-off filters of Test Example 7-9 to Test Example 7-25 was found to be smaller than the amount of change in transmittance in the infrared cut-off filters of Test Example 7-1 to Test Example 7-8. That is, the amount of change in transmittance in the acrylic copolymer containing the repeating unit derived from 4-hydroxyphenyl methacrylate and containing two or more repeating units was found to be smaller than that in the acrylic homopolymer and the acrylic copolymer containing no repeating unit derived from 4-hydroxyphenyl methacrylate. Therefore, it is found that a decrease in absorbance of the infrared cut-off filter due to heating is suppressed when the infrared cut-off filter contains the acrylic copolymer containing the repeating unit derived from 4-hydroxyphenyl methacrylate and containing two or more repeating units.

From the comparison between the amount of change in transmittance in Test Examples 7-19 and 7-20 and the amount of change in transmittance in Test Examples 7-2 and 7-7, it is found that 4-hydroxyphenyl methacrylate has an effect of stabilizing the dye due to its chemical structure, compared with dicyclopentanyl methacrylate and phenyl methacrylate.

According to the infrared cut-off filters of Test Example 7-20 to Test Example 7-25, a decrease in absorbance due to heating was found to be further suppressed when the acrylic copolymer contained 5 parts by weight or more of the repeating unit derived from 4-hydroxyphenyl methacrylate. Further, according to the infrared cut-off filters of Test Example 7-20 to Test Example 7-25, the transmittance was found to have a minimum value when the acrylic copolymer contained 10 parts by weight or more and 20 parts by weight or less of the repeating unit derived from 4-hydroxyphenyl methacrylate. Therefore, it is found that a decrease in absorbance due to heating is particularly prevented when the acrylic copolymer contains 10 parts by weight or more and 20 parts by weight or less of the repeating unit derived from 4-hydroxyphenyl methacrylate.

On the other hand, according to the infrared cut-off filters of Test Example 7-10 to Test Example 7-19, the acrylic copolymer formed from the repeating unit derived from phenyl methacrylate, the repeating unit derived from 4-hydroxyphenyl methacrylate and the repeating unit derived from glycidyl methacrylate was found to have the tendency described below. That is, in the acrylic copolymer containing 15 parts by weight or less of the repeating unit derived from glycidyl methacrylate, a decrease in absorbance due to heating was found to be suppressed compared with the acrylic copolymer containing more than 15 parts by weight of the repeating unit derived from glycidyl methacrylate. Further, in the acrylic copolymer composed of the three components, a decrease in absorbance due to heating was found to be suppressed when the acrylic copolymer contained 10 parts by weight or more and 25 parts by weight or less of the repeating unit derived from 4-hydroxyphenyl methacrylate.

Further, according to Test Example 7-9, the acrylic copolymer formed from the repeating unit derived from dicyclopentanyl methacrylate, the repeating unit derived from methyl methacrylate and the repeating unit derived from 4-hydroxyphenyl methacrylate was found to have the tendency described below. That is, the amount of change in transmittance was found to be small compared with the acrylic homopolymer or the acrylic copolymer containing no repeating unit derived from 4-hydroxyphenyl methacrylate. In other words, a decrease in absorbance due to heating was found to be suppressed.

As described above, according to the third embodiment of the infrared cut-off filter, the solid-state image sensor filter, the solid-state image sensor, and the method for producing a solid-state image sensor filter, the following advantageous effects can be obtained.

(3-1) Due to the acrylic copolymer containing the first repeating unit derived from 4-hydroxyphenyl methacrylate, a decrease in absorbance of the infrared cut-off filter due to heating can be suppressed compared with the case where the acrylic copolymer is formed only from a second repeating unit.

(3-2) A decrease in absorbance of the infrared cut-off filter due to heating can be suppressed compared with the case where the acrylic copolymer is composed of two components, the first repeating unit and the second repeating unit, and contains less than 5 mass % of the first repeating unit.

(3-3) Due to the acrylic copolymer composed of the two components containing 10 mass % or more and 20 mass % or less of the first repeating unit, a decrease in absorbance of the infrared cut-off filter due to heating can be particularly suppressed.

(3-4) The absorbance of the infrared cut-off filter containing the acrylic copolymer composed of three components containing phenyl methacrylate and glycidyl methacrylate can be prevented from decreasing due to heating.

(3-5) The absorbance of the infrared cut-off filter composed of three components containing methyl methacrylate and dicyclopentanyl methacrylate can be prevented from decreasing due to heating.

Modifications of Third Embodiment

The above embodiment can be modified and implemented as below.

The third embodiment is a modification of the first embodiment, and can be implemented in combination with modifications of the barrier layer 14, the color filter, the infrared cut-off filter 13, and the like.

The present application addresses the following. A solid-state image sensor having an infrared cut-off filter is mounted on a mounting substrate by reflow soldering. In this process, the infrared cut-off filter of the solid-state image sensor is heated to a temperature that melts the solder. In addition, in production of the infrared cut-off filter, a polymer solution containing a polymer obtained by a polymerization reaction of monomers is used. The polymer solution may contain a polymerization initiator used for the polymerization reaction of the monomers. Such polymerization initiators may be activated by heating the infrared cut-off filter to generate radicals. The radicals generated by the polymerization initiator may cause decomposition and denaturation of the cyanine dye. As a result, the infrared light transmittance of the infrared cut-off filter after heating may be higher than the infrared light transmittance of the infrared cut-off filter before heating. That is, expected spectral characteristics of the infrared cut-off filter may be deteriorated by heating.

The present invention has an aspect to provide an infrared cut-off filter capable of preventing the infrared cut-off filter from being deteriorated by heating, a solid-state image sensor filter, a solid-state image sensor, and a method for producing a solid-state image sensor filter.

An infrared cut-off filter includes: a cyanine dye containing a cation having a polymethine and a nitrogen-containing heterocycle located at each end of the polymethine, and tris(pentafluoroethyl) trifluorophosphate; and a copolymer containing a first repeating unit derived from a first monomer and a second repeating unit derived from a second monomer which is different from the first monomer. The first monomer has a phenolic hydroxyl group.

A method for producing a solid-state image sensor filter includes the steps of: forming an infrared cut-off filter including: a cyanine dye containing a cation having a polymethine and a nitrogen-containing heterocycle located at each end of the polymethine, and tris(pentafluoroethyl) trifluorophosphate; and a copolymer containing a first repeating unit derived from a first monomer having a phenolic hydroxyl group and a second repeating unit derived from a second monomer which is different from the first monomer; and patterning the infrared cut-off filter by dry etching.

A polymer solution used for forming the infrared cut-off filter may contain a radical polymerization initiator used for polymerization of the monomer. The radical polymerization initiator contained in the infrared cut-off filter may be activated to generate radicals when the infrared cut-off filter is heated. According to the above configuration, the copolymer containing the first repeating unit captures radicals. Therefore, even when the infrared cut-off filter contains a radical polymerization initiator, the copolymer containing the first repeating unit and the second repeating unit can prevent the cyanine dye from being decomposed or denatured by radicals. Thus, the infrared cut-off filter can be prevented from being deteriorated by heating.

REFERENCE SIGNS LIST

10 . . . Solid-state image sensor
10F . . . Solid-state image sensor filter
11 . . . Photoelectric conversion element
12R . . . Red filter
12G . . . Green filter
12B . . . Blue filter
12P . . . Infrared pass filter
13 . . . Infrared cut-off filter
13H . . . Through-hole
14 . . . Barrier layer
15R . . . Red microlens
15G . . . Green microlens
15B . . . Blue microlens
15P . . . Infrared microlens Obviously, numerous modifications and variations of the present invention are possible in light of the above teachings. It is therefore to be understood that within the scope of the appended claims, the invention may be practiced otherwise than as specifically described herein.

What is claimed is:

1. An infrared cut-off filter, comprising:

a film comprising a cyanine dye and a copolymer, wherein the cyanine dye includes tris (pentafluoroethyl) trifluorophosphate and a cation having a polymethine and a nitrogen-containing heterocycle at each end of the polymethine, the copolymer includes a first repeating unit from a first monomer and a second repeating unit from a second monomer different from the first monomer, the first monomer includes a phenolic hydroxyl group, and the copolymer has a glass transition temperature of 75° C. or higher.

2. The infrared cut-off filter according to claim 1, wherein the second repeating unit has formula (1) or formula (2):

Formula (1)

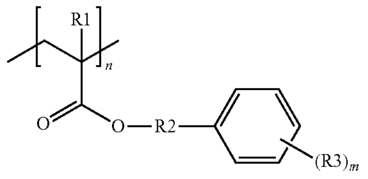

Formula (2)

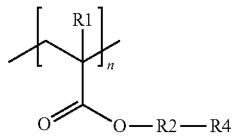

in the formulae (1) and (2), R1 is a hydrogen atom or a methyl group, R2 is a single bond, a linear alkylene group having 1 or more carbon atoms, or a branched alkylene group having 3 or more carbon atoms, R3 is a hydrogen atom or a predetermined substituent, m is any integer from 1 to 5 when R3 is a substituent in the formula (1), and R4 is an alicyclic structure having 3 or more carbon atoms in the formula (2).

3. The infrared cut-off filter according to claim 1, wherein the copolymer consists of the first repeating unit and the second repeating unit, and the copolymer includes 5 wt. %-30 wt. % of the first repeating unit.

4. The infrared cut-off filter according to claim 1, wherein the copolymer further includes a third repeating unit from glycidyl methacrylate.

5. The infrared cut-off filter according to claim 4, wherein the copolymer includes 70 wt. % or more of the second repeating unit and 5 wt. %-20 wt. % of the third repeating unit, and includes the first repeating unit at a weight ratio of 0.5 or more with respect to the third repeating unit.

6. The infrared cut-off filter according to claim 1, wherein the copolymer has a weight average molecular weight of 30,000-150,000.

7. The infrared cut-off filter according to claim 1, wherein the film includes a monomer remaining in the film at a weight percentage of 20% or less with respect to a sum of a weight of the copolymer and a weight of the monomer, which is represented by $$(MM/MS)\times 100 \leq 20\%$$

where MM is the weight of the monomer, and MS is the sum of the weight of the copolymer and the weight of the monomer.

8. The infrared cut-off filter according to claim 1, wherein the film includes an additive having a radical scavenging ability.

9. The infrared cut-off filter according to claim 8, wherein the additive comprises N-nitrosophenylhydroxylamine aluminum salt.

10. The infrared cut-off filter according to claim 1, wherein the film further includes less than 0.35 parts by weight of an organic peroxide including an aromatic ring relative to 100 parts by weight of the copolymer.

11. An infrared cut-off filter, comprising:

a film comprising a cyanine dye and a copolymer, wherein the cyanine dye includes tris(pentafluoroethyl) trifluorophosphate and a cation having a polymethine and a nitrogen-containing heterocycle at each end of the polymethine, the copolymer consists of a first repeating unit from a first monomer and a second repeating unit from a second monomer different from the first monomer, the first monomer includes a phenolic hydroxyl group, and the copolymer includes 5 wt. %-30 wt. % of the first repeating unit.

12. The infrared cut-off filter according to claim 11, wherein the second repeating unit has formula (1) or formula (2):

Formula (1)

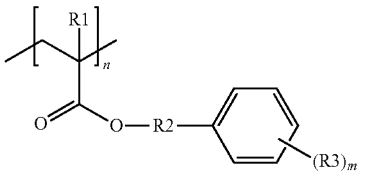

-continued

Formula (2)

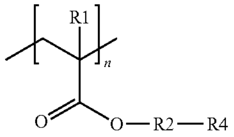

in the formulae (1) and (2), R1 is a hydrogen atom or a methyl group, R2 is a single bond, a linear alkylene group having 1 or more carbon atoms, or a branched alkylene group having 3 or more carbon atoms, R3 is a hydrogen atom or a predetermined substituent, m is any integer from 1 to 5 when R3 is a substituent in the formula (1), and R4 is an alicyclic structure having 3 or more carbon atoms in the formula (2).

13. An infrared cut-off filter, comprising:

a film comprising a cyanine dye and a copolymer, wherein the cyanine dye includes tris (pentafluoroethyl) trifluorophosphate and a cation having a polymethine and a nitrogen-containing heterocycle at each end of the polymethine, the copolymer includes a first repeating unit from a first monomer, a second repeating unit from a second monomer different from the first monomer, and a third repeating unit from glycidyl methacrylate, and the first monomer includes a phenolic hydroxyl group.

14. The infrared cut-off filter according to claim 13, wherein the second repeating unit has formula (1) or formula (2):

Formula (1)

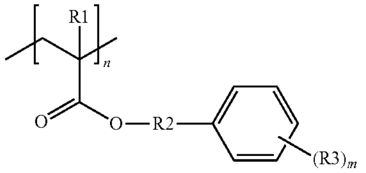

Formula (2)

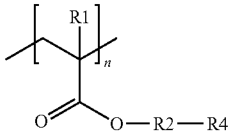

in the formulae (1) and (2), R1 is a hydrogen atom or a methyl group, R2 is a single bond, a linear alkylene group having 1 or more carbon atoms, or a branched alkylene group having 3 or more carbon atoms, R3 is a hydrogen atom or a predetermined substituent, m is any integer from 1 to 5 when R3 is a substituent in the formula (1), and R4 is an alicyclic structure having 3 or more carbon atoms in the formula (2).

15. The infrared cut-off filter according to claim 13, wherein the copolymer includes 70 wt. % or more of the second repeating unit and 5 wt. %-20 wt. % of the third repeating unit, and includes the first repeating unit at a weight ratio of 0.5 or more with respect to the third repeating unit.

16. The infrared cut-off filter according to claim 13, wherein the film includes an additive having a radical scavenging ability.

17. The infrared cut-off filter according to claim 16, wherein the additive comprises N-nitrosophenylhydroxylamine aluminum salt.

18. The infrared cut-off filter according to claim 13, wherein the film further includes less than 0.35 parts by weight of an organic peroxide including an aromatic ring relative to 100 parts by weight of the copolymer.

19. An infrared cut-off filter, comprising:

a film comprising a cyanine dye and a copolymer, wherein the cyanine dye includes tris(pentafluoroethyl) trifluorophosphate and a cation having a polymethine and a nitrogen-containing heterocycle at each end of the polymethine, the copolymer includes a first repeating unit from a first monomer and a second repeating unit from a second monomer different from the first monomer, and the first monomer includes a phenolic hydroxyl group, wherein the film includes a monomer remaining in the film at a weight percentage of 20% or less with respect to a sum of a weight of the copolymer and a weight of the monomer, which is represented by $$(MM/MS)\times 100\leq 20\%$$

where MM is the weight of the monomer, and MS is the sum of the weight of the copolymer and the weight of the monomer.

* * * * *